(12) United States Patent
Song et al.

(10) Patent No.: US 12,225,795 B2
(45) Date of Patent: Feb. 11, 2025

(54) DISPLAY DEVICE

(71) Applicant: SAMSUNG DISPLAY CO., LTD., Yongin-si (KR)

(72) Inventors: Sang Hyeon Song, Suwon-si (KR); Seung-Soo Ryu, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/469,543

(22) Filed: Sep. 18, 2023

(65) Prior Publication Data

US 2024/0008331 A1    Jan. 4, 2024

Related U.S. Application Data

(63) Continuation of application No. 17/418,175, filed as application No. PCT/KR2019/018291 on Dec. 23, 2019, now Pat. No. 11,765,950.

(30) Foreign Application Priority Data

Dec. 26, 2018  (KR) .......................... 10-2018-0169794

(51) Int. Cl.
| | |
|---|---|
| *H10K 59/131* | (2023.01) |
| *H10K 59/40* | (2023.01) |
| *G02F 1/1333* | (2006.01) |
| *G02F 1/1362* | (2006.01) |

(52) U.S. Cl.
CPC .......... *H10K 59/131* (2023.02); *H10K 59/40* (2023.02); *G02F 1/13338* (2013.01); *G02F 1/136286* (2013.01)

(58) Field of Classification Search
CPC ...... H10K 59/131; H10K 59/40; H10K 50/80; G02F 1/13338; G02F 1/136286; G02F 1/1345
See application file for complete search history.

(56) References Cited

U.S. PATENT DOCUMENTS 10,172,233 B2    1/2019  Chung et al.
2012/0256865 A1  10/2012 Hashimoto et al.
(Continued)

FOREIGN PATENT DOCUMENTS

| CN | 108957880 A | 12/2018 |
|---|---|---|
| EP | 2518602 A1 | 10/2012 |

(Continued)

OTHER PUBLICATIONS

International Search Report for corresponding Application No. PCT/KR2019/018291 dated Apr. 29, 2020, 4 pp.

(Continued)

*Primary Examiner* — Kyoung Lee
(74) *Attorney, Agent, or Firm* — Lewis Roca Rothgerber Christie LLP

(57) ABSTRACT

A display device includes: a first substrate; a second substrate; first signal lines on the first substrate; second signal lines on the second substrate; first lateral wires on a lateral side of a first edge of the first substrate, and connected to end portions of the first signal lines; and second lateral wires on a lateral side of a second edge of the second substrate, and connected to end portions of the second signal lines. The first and second lateral wires are located in at least one first region and at least one second region, the at least one first region and the at least one second region being spaced from each other on the lateral sides of the first substrate and the second substrate. The at least one first region includes the first lateral wires, and the at least one second region includes the second lateral wires.

13 Claims, 18 Drawing Sheets

(56) References Cited

U.S. PATENT DOCUMENTS

| | | | |
|---|---|---|---|
| 2012/0327023 A1 | 12/2012 | Hashimoto et al. | |
| 2015/0097810 A1 | 4/2015 | Aoki et al. | |
| 2015/0185942 A1 | 7/2015 | Kim et al. | |
| 2017/0090644 A1 | 3/2017 | Yao et al. | |
| 2017/0357121 A1 | 12/2017 | Cho et al. | |
| 2017/0358602 A1 | 12/2017 | Bae et al. | |
| 2018/0061367 A1 | 3/2018 | Ye et al. | |
| 2018/0088388 A1* | 3/2018 | Furuta | G02F 1/13452 |
| 2018/0173042 A1 | 6/2018 | Kim et al. | |
| 2020/0043948 A1 | 2/2020 | Liu et al. | |

FOREIGN PATENT DOCUMENTS

| | | |
|---|---|---|
| KR | 10-2007-0062742 A | 6/2007 |
| KR | 10-2012-0045291 A | 5/2012 |
| KR | 10-2015-0011731 A | 2/2015 |
| KR | 10-2015-0072743 A | 6/2015 |
| KR | 10-2017-0003388 A | 1/2017 |
| KR | 10-2017-0078466 A | 7/2017 |
| KR | 10-2017-0139211 A | 12/2017 |
| KR | 10-2017-0139217 A | 12/2017 |
| KR | 10-2018-0006576 A | 1/2018 |
| KR | 10-2018-0028096 A | 3/2018 |
| KR | 10-2018-0070783 A | 6/2018 |
| WO | WO 2018/194305 A1 | 10/2018 |

OTHER PUBLICATIONS

Korean Notice of Allowance for Patent Application No. 10-2018-0169794, dated Jul. 16, 2024, 6 pages.

* cited by examiner

DISPLAY DEVICE

CROSS-REFERENCE TO RELATED APPLICATIONS

This application is a continuation of U.S. patent application Ser. No. 17/418,175, filed Jun. 24, 2021, which is a U.S. National Phase Patent Application of International Patent Application Number PCT/KR2019/018291, filed on Dec. 23, 2019, which claims priority to and the benefit of Korean Patent Application No. 10-2018-0169794, filed Dec. 26, 2018, the entire content of all of which is incorporated herein by reference.

BACKGROUND

1. Field

Aspects of embodiments of the present disclosure relate to a display device. More particularly, aspects of embodiments of the present disclosure relate to a display device having a reduced bezel area.

2. Description of the Related Art

Display devices such as a liquid crystal display (LCD) or a light emitting diode display include a display panel on which a plurality of pixels for displaying images are formed, and a driving circuit unit for driving the display panel. Each pixel includes a pixel electrode for receiving a data signal, and the pixel electrode is connected to at least one transistor to receive a data signal.

The display panel may include a display area in which a plurality of pixels are formed, and a bezel area positioned near the display area and for displaying no images. Various driving circuits and wires may be positioned in the bezel area.

The display device may include a touch sensing function available for interaction with a user, in addition to a function for displaying images. The touch sensing function may be realized by a touch sensor formed on the display panel.

The above information disclosed in this Background section is for enhancement of understanding of the background of the present disclosure, and therefore, it may contain information that does not constitute prior art.

SUMMARY

One or more embodiments of the present disclosure are directed to a display device having a reduced bezel area.

According to an embodiment of the present disclosure, a display device includes: a first substrate and a second substrate; a plurality of first signal lines formed on the first substrate; a plurality of second signal lines formed on the second substrate; a plurality of first lateral wires positioned on a lateral side of a first edge of the first substrate, and connected to an end portion of the first signal line; and a plurality of second lateral wires positioned on a lateral side of a second edge of the second substrate, and connected to an end portion of the second signal line. The plurality of first lateral wires and the plurality of second lateral wires are disposed in at least one first region and at least one second region that are spaced from each other on the lateral sides of the first substrate and the second substrate, the first region includes a plurality of the first lateral wires, and the second region includes a plurality of the second lateral wires.

The first region may not include the second lateral wire, and the second region may not include the first lateral wire.

The display device may further include: a plurality of access wires electrically connected to the first lateral wire and the second lateral wire; and a flexible printed circuit film attached to the lateral sides of the first substrate and the second substrate. The plurality of access wires may be disposed in at least one third region corresponding to the first region and at least one fourth region corresponding to the second region.

The display device may further include a driving circuit unit positioned on the flexible printed circuit film, and the plurality of access wires may be connected to the driving circuit unit.

The plurality of first signal lines may include a plurality of data lines for transmitting data signals, and the plurality of second signal lines may include a plurality of touch signal lines for transmitting touch signals.

The first substrate may include a display area for displaying an image, and a display bezel area positioned around the display area. The second substrate may include a touch region for sensing a touch, and a touch bezel area positioned around the touch region peripheral. The plurality of first signal lines may include a plurality of first peripheral signal lines positioned in a first display bezel area positioned between the display area and the first edge from among the display bezel area, and the plurality of second signal lines may include a plurality of second peripheral signal lines positioned in a first touch bezel area positioned between the touch region and the second edge from among the touch bezel area.

The first peripheral signal line connected to the first lateral wire positioned on at least one border from among respective borders of the one first region may extend in a direction that is substantially perpendicular to the first edge.

The display device may include a driving circuit unit positioned on the flexible printed circuit film, and the plurality of access wires may be connected to the driving circuit unit.

The second peripheral signal line may be positioned on a side of the second substrate that does not face the first substrate.

The second peripheral signal line may be positioned on a side that faces the first substrate from among the second substrate.

The plurality of second lateral wires may be positioned to gather to the one second region positioned in a center of the second edge, and the first lateral wires may be spaced from the second region and may be positioned in two of the first regions facing each other with the second region therebetween.

The at least one second region may be provided as one, and the plurality of second lateral wires may be positioned in the one second region positioned at one border of the second edge. The at least one first region may be provided as one, and the plurality of first lateral wires may be positioned in the one first region spaced from the second region. The first substrate may include a display area for displaying an image, and a display bezel area positioned around the display area. The first signal lines may include a plurality of first peripheral signal lines positioned in a first display bezel area positioned between the display area and the first edge from among the display bezel area, and the plurality of first peripheral signal lines may extend in a direction that is substantially perpendicular to the first edge.

The plurality of second lateral wires may be disposed in two of the second regions positioned near respective borders of the second edge, and the plurality of first lateral wires may be positioned in at least one of the first region positioned between the two second regions.

The plurality of second lateral wires may be disposed in at least three of the second regions that are spaced from each other, and the plurality of first lateral wires may be disposed in a plurality of the first regions which are alternately disposed with the at least three second regions.

According to an embodiment of the present disclosure, a display device includes: a first substrate and a second substrate; a plurality of first signal lines formed on the first substrate; a plurality of second signal lines formed on the second substrate; a plurality of first lateral wires positioned on a lateral side of a first edge of the first substrate, and connected to an end portion of the first signal line; and a plurality of second lateral wires positioned on a lateral side of a second edge of the second substrate, and connected to an end portion of the second signal line. The second lateral wires are positioned in a second region positioned in a center of the second edge, and the first lateral wires are positioned in two first regions spaced from the second region and facing each other with the second region therebetween.

According to an embodiment of the present disclosure a display device includes: a first substrate and a second substrate; a plurality of first signal lines formed on the first substrate; a plurality of second signal lines formed on the second substrate; a plurality of first lateral wires positioned on a lateral side of a first edge of the first substrate, and connected to an end portion of the first signal line; and a plurality of second lateral wires positioned on a lateral side of a second edge of the second substrate, and connected to an end portion of the second signal line. The first signal lines include a plurality of data lines, the first lateral wires are disposed in at least one first region on the lateral side of the first substrate, and an end portion of the data line connected to the first lateral wire positioned on at least one border from among respective borders of the first region extends in a direction that is substantially perpendicular to the first edge in a plan view.

The first region may not include the second lateral wire, and the second region may not include the first lateral wire.

The display device may further include a plurality of access wires electrically connected to the first lateral wire and the second lateral wire, and a flexible printed circuit film attached to the lateral sides of the first substrate and the second substrate. The plurality of access wires may be disposed in at least one third region corresponding to the first region and at least one fourth region corresponding to the second region.

According to the embodiments of the present disclosure, the bezel area of the display device may be reduced.

BRIEF DESCRIPTION OF THE DRAWINGS

The above and other aspects and features of the present disclosure will be more clearly understood from the following detailed description of the illustrative, non-limiting example embodiments with reference to the accompanying drawings.

DETAILED DESCRIPTION

Figure 1:
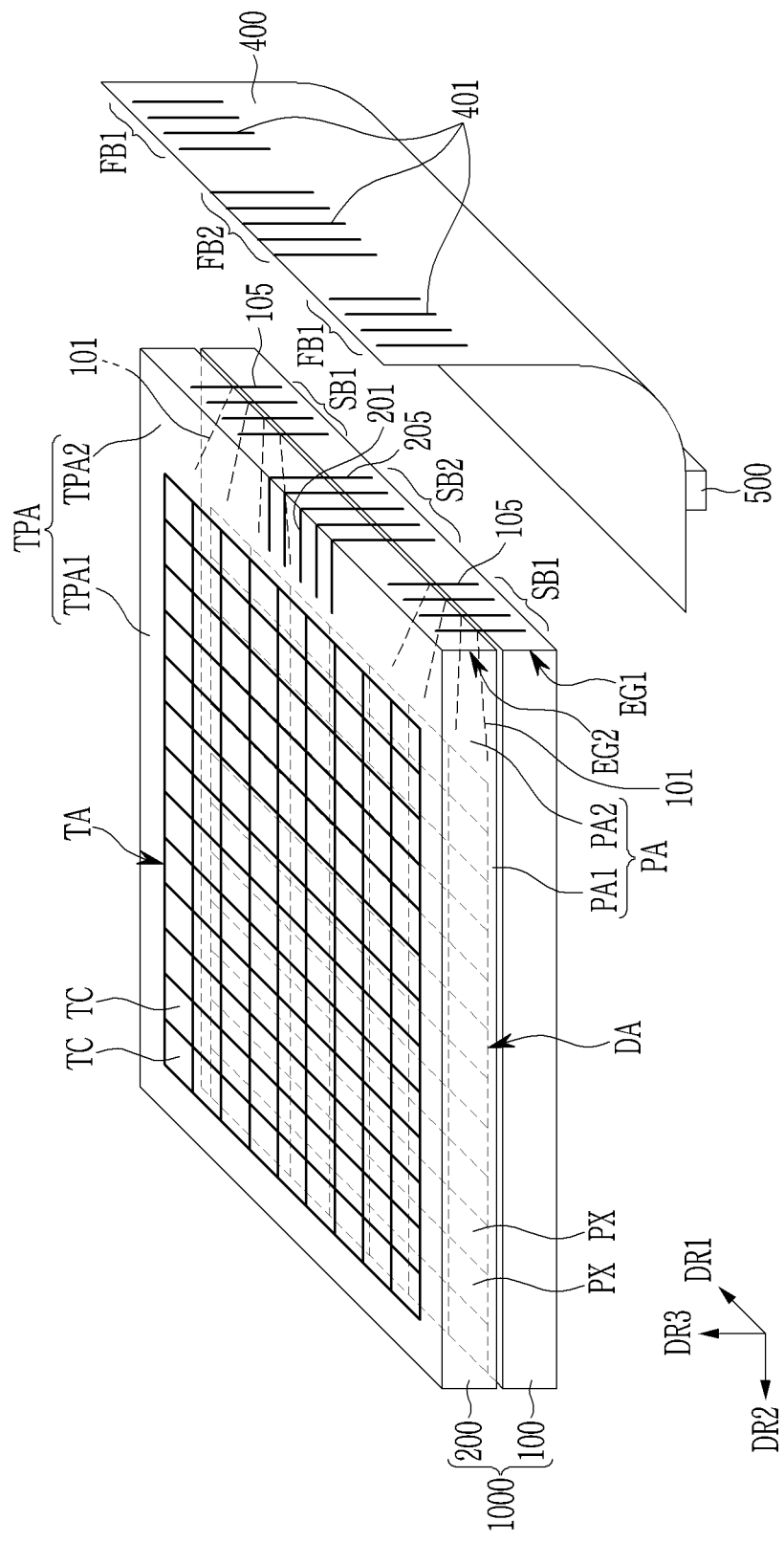
FIG. 1 shows a perspective view of a display device according to an embodiment of the present disclosure.

Hereinafter, example embodiments will be described in more detail with reference to the accompanying drawings, in which like reference numbers refer to like elements throughout. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Unless otherwise noted, like reference numerals denote like elements throughout the attached drawings and the written description, and thus, descriptions thereof may not be repeated.

In the drawings, the relative sizes of elements, layers, and regions may be exaggerated and/or simplified for clarity. For example, the thicknesses of some layers, films, panels, regions, and the like in the drawings may be exaggerated for clarity and/or for convenience of illustration. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "on," "connected to," or "coupled to" another element or layer, it can be directly on, connected to, or coupled to the other element or layer, or one or more intervening elements or layers may be present. Similarly, when a layer, an area, or an element is referred to as being "electrically connected" to another layer, area, or element, it may be directly electrically connected to the other layer, area, or element, and/or may be indirectly electrically connected with one or more intervening layers, areas, or elements therebetween. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present disclosure. As used herein, the singular forms "a" and "an" are intended to include the plural forms as well, unless the context clearly indicates otherwise. It will be further understood that the terms "comprises," "comprising," "includes," "including," "has," "have," and "having," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. For example, the expression "A and/or B" denotes A, B, or A and B. Expressions such as "at least one of," when preceding a list of elements, modify the entire list of elements and do not modify the individual elements of the list. For example, the expression "at least one of a, b, or c" indicates only a, only b, only c, both a and b, both a and c, both b and c, all of a, b, and c, or variations thereof.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

As used herein, a plan view or a plane view represents a view for observing a side that is parallel to two directions (e.g., a first direction (DR1) and a second direction (DR2)) crossing each other, and a cross-sectional view represents a view for observing a side that is cut in a direction (e.g., a third direction (DR3)) that is perpendicular to a side that is parallel to the first direction (DR1) and the second direction (DR2). Further, when two constituent elements overlap with each other, it may mean that the two constituent elements overlap with each other in the third direction (DR3), for example, in the direction that is perpendicular to an upper side of a substrate.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 shows a perspective view of a display device according to an embodiment of the present disclosure.

The display device includes a display panel 1000 and a flexible printed circuit (FPC) film 400. The display panel 1000 may include a first substrate 100 and a second substrate 200 that are attached to (e.g., that are bonded to) each other. Respective principal surfaces of the first substrate 100 and the second substrate 200 are disposed to be in parallel with or substantially in parallel with each other. The respective principal surfaces of the first substrate 100 and the second substrate 200 are illustrated in FIG. 1 as extending in the first direction (DR1) and the second direction (DR2).

The first substrate 100 and the second substrate 200 may have a fixed shape, and may be flexible. The first substrate 100 and the second substrate 200 may include glass and/or plastic. When the first substrate 100 and the second substrate 200 are flexible, they may include various suitable types of plastic, for example, such as polyethylene terephthalate (PET), polyethylene naphthalate (PEN), polycarbonate (PC), polyarylate (PAR), polyetherimide (PEI), polyethersulfone (PES), or polyimide (PI), a metal thin film, or very thin glass.

The first substrate 100 includes a display area (DA) for displaying images, and a bezel area (PA) positioned around (e.g., to surround around a periphery of) the display area (DA) and for displaying no images.

A plurality of pixels (PX) and a plurality of signal lines are formed at (e.g., in or on) the display area (DA). The pixel (PX) is a unit (e.g., a minimum unit) for displaying an image, and may include at least one pixel electrode. The pixel (PX) may emit a desired luminance corresponding to a gray (e.g., a gray level or a grayscale value) of an input image signal. The pixel (PX) may represent a unit region for emitting light in a plan view (e.g., a view from a direction that is perpendicular to or substantially perpendicular to a top surface of the display panel 1000), and may include various suitable constituent elements in a cross-sectional view, for example, such as a transistor and/or a light-emitting device, to be configured to emit light.

In a plan view, a lower border of the display area (DA) may extend in parallel or substantially in parallel with the first direction (DR1), but the present disclosure is not limited thereto.

The bezel area (PA) may include a first bezel area PA1 and a second bezel area PA2. The first bezel area PA1 may be positioned between an edge (e.g., edges) of the first substrate 100, excluding one edge (EG1) of the first substrate 100, and the display area (DA). The second bezel area PA2 may be positioned between the one edge (EG1) of the first substrate 100 and the display area (DA).

A plurality of signal lines may extend to the bezel area (PA), and a portion of the signal lines extending to the second bezel area (PA2) may be referred to as a peripheral signal line 101. Respective peripheral signal lines 101 are electrically connected to a lateral wire 105 formed on a lateral side of the edge (e.g., the one edge) (EG1) of the first substrate 100. An end portion exposed at the edge (EG1) of the peripheral signal line 101 may be electrically connected to the lateral wire 105.

The lateral wire 105 may extend to a lateral side of a corresponding edge (EG2) of the second substrate 200. The edge (e.g., the corresponding edge) (EG2) of the second substrate 200 is arranged in parallel with or substantially in parallel with the edge (EG1) of the first substrate 100. The edge (EG1) and the edge (EG2) may extend in parallel with or substantially in parallel with the first direction (DR1).

The first substrate 100 on which the pixel (PX) is formed may also be referred to as a display unit (e.g., a display or a display layer).

The second substrate 200 may include a touch region (TA) for sensing a touch (e.g., an external touch) from an outside of the display device, and a touch bezel area (TPA) positioned around (e.g., to surround around a periphery of) the touch region (TA).

A plurality of touch cells (TC) are formed at (e.g., in or on) the touch region (TA). The touch cell (TC) is a unit (e.g., a minimum unit) for sensing an external touch, and may include at least one touch electrode. The touch cell (TC) may sense the external touch using various suitable methods, for example, such as a mutual capacitive type or a self-capacitive type, and may output a touch output signal.

The touch bezel area (TPA) may include a first touch bezel area (TPA1) and a second touch bezel area (TPA2). The first touch bezel area (TPA1) may be positioned between an edge (e.g., edges) of the second substrate 200, excluding an edge (e.g., one edge) (EG2) of the second substrate 200, and the touch region (TA). The second touch bezel area (TPA2) may be positioned between the edge (e.g., the one edge) (EG2) of the second substrate 200 and the touch region (TA). In a plan view, the second touch bezel area (TPA2) may overlap with the second bezel area (PA2) of the first substrate 100.

A plurality of touch signal lines connected to the touch cells (TC) may be positioned at (e.g., in or on) the touch bezel area (TPA). The touch signal lines may extend to the second touch bezel area (TPA2). A touch signal line portion extending to the second touch bezel area (TPA2) may be referred to as a touch peripheral signal line 201. Respective touch peripheral signal lines 201 are electrically connected to a touch lateral wire 205 formed on a lateral side of the edge (EG2) of the second substrate 200. An end portion exposed at the edge (EG2) of the touch peripheral signal line 201 may be electrically connected to the touch lateral wire 205. The touch lateral wire 205 may extend to a lateral side of the edge (EG1) of the first substrate 100.

The second substrate 200 on which the touch cell (TC) and the touch signal line are formed may also be referred to as a touch unit (e.g., a touch panel or a touch sensing layer).

A lateral side of the edge (EG1) of the first substrate 100 and a lateral side of the edge (EG2) of the second substrate 200 may configure (e.g., may form or may define) a planar side. The lateral side of the edge (EG1) of the first substrate 100 and the lateral side of the edge (EG2) of the second substrate 200 may extend in parallel with or substantially in parallel with the third direction (DR3) as one plane, but the present disclosure is not limited thereto. In other words, the lateral side of the edge (EG1) of the first substrate 100 and the lateral side of the edge (EG2) of the second substrate 200 may be perpendicular to or substantially perpendicular to the principal surfaces of the first substrate 100 and the second substrate 200, but the present disclosure is not limited thereto. The lateral side of the edge (EG1) of the first substrate 100 and the lateral side of the edge (EG2) of the second substrate 200 may also be collectively referred to as a lateral side of the display panel of (e.g., corresponding to) the edges (EG1 and EG2) (or more simply as the lateral side of the display panel 1000).

The lateral wire 105 and the touch lateral wire 205 formed on the lateral side of the display panel of the edges (EG1 and EG2) are disposed at (e.g., in or on) a first region (SB1) and a second region (SB2) that are separated from each other and spaced from each other (e.g., that are spaced apart from each other). In other words, at least one first region (SB1) and at least one second region (SB2) may be positioned at (e.g., in or on) the lateral side of the display panel of the edges (EG1 and EG2), and the first region (SB1) and the second region (SB2) may be separated from each other and may be spaced from each other (e.g., may be spaced apart from each other). The first region (e.g., each first region) (SB1) may include a plurality of lateral wires 105 but no touch lateral wire 205, and the second region (e.g., each second region) (SB2) may include a plurality of touch lateral wires 205 but no lateral wire 105. FIG. 1 illustrates an example in which one second region (SB2) is positioned between two first regions (SB1) that are positioned at (e.g., in or on) respective borders (e.g., respective ends) of the lateral side of the display panel of the edges (EG1 and EG2). When the display device includes a plurality of first regions (SB1) and a plurality of second regions (SB2), the first regions (SB1) and the second regions (SB2) may be alternately arranged along the first direction (DR1) or along the second direction (DR2), as an example.

A driving circuit unit (e.g., a driving circuit or a driver) 500 is connected to the flexible printed circuit film 400, and a plurality of access wires 401 are formed on the flexible printed circuit film 400. A portion of the flexible printed circuit film 400 in which the plurality of access wires 401 are formed may be attached to the lateral side of the display panel of the edges (EG1 and EG2), and may be electrically connected to the display panel 1000. The flexible printed circuit film 400, excluding the portion attached to the lateral side of the display panel of the edges (EG1 and EG2), may be bent below (e.g., underneath) the display panel 1000, and the driving circuit unit 500 may be positioned on one side of the flexible printed circuit film 400 that is positioned below (e.g., underneath) the display panel 1000.

The plurality of access wires 401 may be disposed at (e.g., in or on) at least one third region (FB1) and at least one fourth region (FB2) of the flexible printed circuit film 400, which may correspond to the first region (SB1) and the second region (SB2), respectively, positioned on the lateral side of the display panel of the edges (EG1 and EG2). The third region (FB1) and the fourth region (FB2) may be separated from each other and may be spaced from each other (e.g., may be spaced apart from each other) on the flexible printed circuit film 400. The third region (e.g., each third region) (FB1) may include a plurality of access wires 401 that are connected to corresponding ones of the plurality of lateral wires 105 of the display panel 1000, and the fourth region (e.g., each fourth region) (FB2) may include a plurality of access wires 401 that are connected to corresponding ones of the plurality of touch lateral wires 205 of the display panel 1000. FIG. 1 illustrates an example in which one fourth region (FB2) is positioned between two third regions (FB1) that are positioned at (e.g., in or on) respective borders (e.g., respective ends) of the flexible printed circuit film 400.

The plurality of access wires 401 may extend to the driving circuit unit 500, and may be connected to the driving circuit unit 500.

The display device according to one or more embodiments may include the flexible printed circuit film 400 connected to the lateral side of the display panel 1000.

Figure 2:
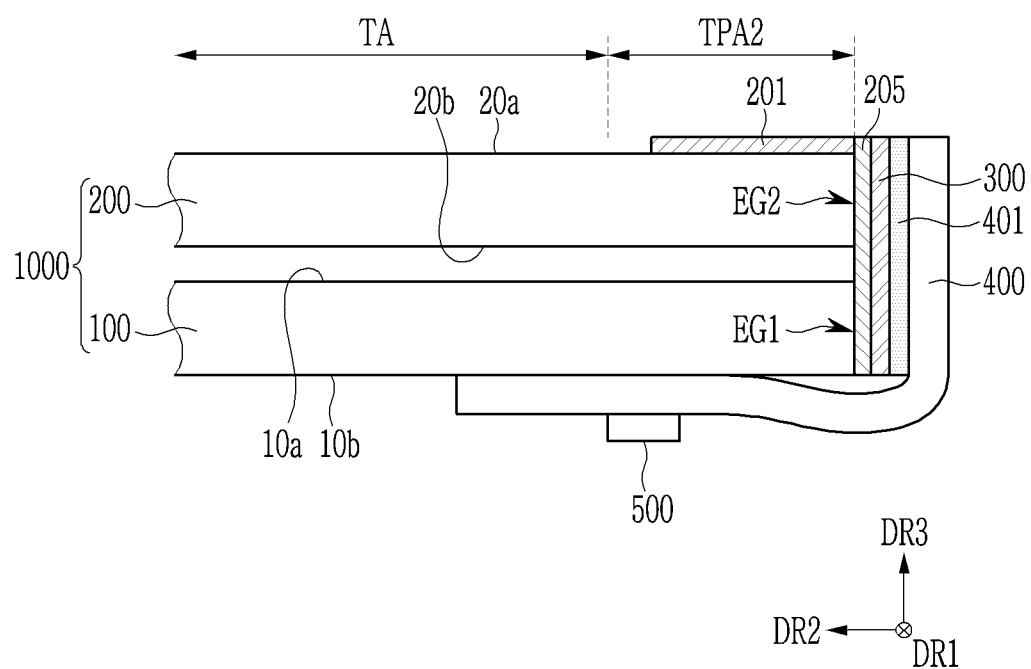
FIGS. 2-3 show cross-sectional views of different portions of the display device shown in FIG. 1, respectively.
Figure 3:
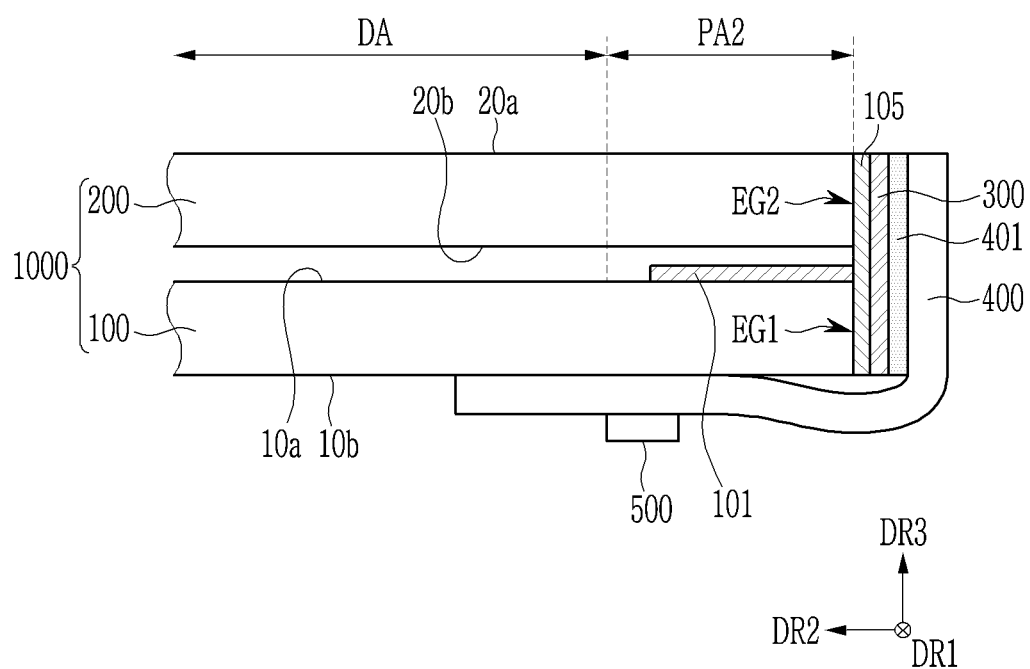

FIG. 2 and FIG. 3 show a cross-sectional view of different portions of the display device shown in FIG. 1, respectively. In more detail, FIG. 2 shows a cross-sectional view of a portion of the display device in which a touch peripheral signal line 201 and a touch lateral wire 205 are positioned, and FIG. 3 shows a cross-sectional view of a portion of the display device in which a peripheral signal line 101 and a lateral wire 105 are positioned.

Referring to FIG. 1, FIG. 2, and FIG. 3, the first substrate 100 includes an upper side 10a and a lower side 10b as the respective sides of the first substrate 100, and the second substrate 200 includes an upper side 20a and a lower side 20b as the respective sides of the second substrate 200. The upper side 10a of the first substrate 100 may face the lower side 20b of the second substrate 200.

The touch peripheral signal line 201 may be formed on the upper side 20a of the second substrate 200, and the peripheral signal line 101 may be formed on the upper side 10a of the first substrate 100.

The lateral wire 105 and the touch lateral wire 205 may be conductive wires including at least one metal. The touch lateral wire 205 may be connected to the touch peripheral signal line 201, and the lateral wire 105 may be connected to the peripheral signal line 101. The lateral wire 105 and the touch lateral wire 205 may be further formed at (e.g., in or on) a region between the first substrate 100 and the second substrate 200.

A conductive connector 300 may be positioned among the access wire 401 formed on the flexible printed circuit film 400, the lateral wire 105, and the touch lateral wire 205. The connector 300 may include an anisotropic conductive film (ACF) including a conductive ball, and the connector 300 may be a conductive connection electrode formed by the conductive ball. The connector 300 may electrically connect the corresponding access wires 401 of the flexible printed circuit film 400 to the lateral wire 105 and the touch lateral wire 205.

The flexible printed circuit film 400 is bent below (e.g., underneath) the display panel 1000, and a portion of the flexible printed circuit film 400 positioned below (e.g., underneath) the display panel 1000 may be fixed to (e.g., attached to or connected to) the lower side (e.g., a rear surface) of the display panel 1000. The driving circuit unit 500 may be positioned on the lower side of the flexible printed circuit film 400 that is fixed to the lower side of the display panel 1000. As another example, the driving circuit unit 500 may be positioned between the portion of the flexible printed circuit film 400 that is fixed to the lower side of the display panel 1000 and the lower side 10b of the first substrate 100 of the display panel 1000.

The driving circuit unit 500 may include a display driving circuit for displaying images, and a touch driving circuit for generating contact information (e.g., for generating touch event information). The display driving circuit may drive the plurality of pixels (PX) included at (e.g., in or on) the first substrate 100, or in other words, the display unit, to display an image. The touch driving circuit may input a signal to the plurality of touch cells (TC) included at (e.g., in or on) the second substrate 200, or in other words, the touch unit, or may receive a touch output signal and may process the same, to generate the contact information. The driving circuit unit 500 may be realized with an integrated circuit (IC) chip including a display driving circuit and a touch driving circuit, and may include a plurality of IC chips including the display driving circuit and the touch driving circuit, respectively.

Referring to FIG. 2 and FIG. 3, a part of the flexible printed circuit film 400 that is bent at a lower corner of the first substrate 100 may be spaced apart from the lower side 10b of the first substrate 100 to form a space therebetween. The space formed between the flexible printed circuit film 400 and the lower side 10b of the first substrate 100 may be filled with air, and/or a buffer member with an insulation property may be positioned in the space. However, the present disclosure is not limited thereto.

Figure 4:
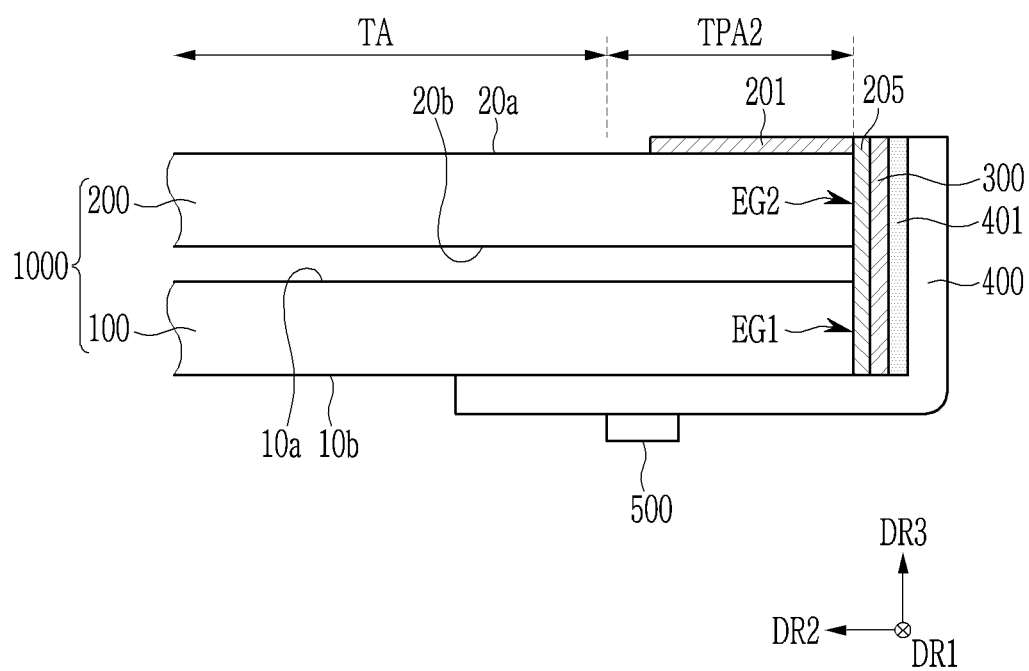
FIGS. 4-5 show cross-sectional views of different portions of the display device shown in FIG. 1, respectively.
Figure 5:
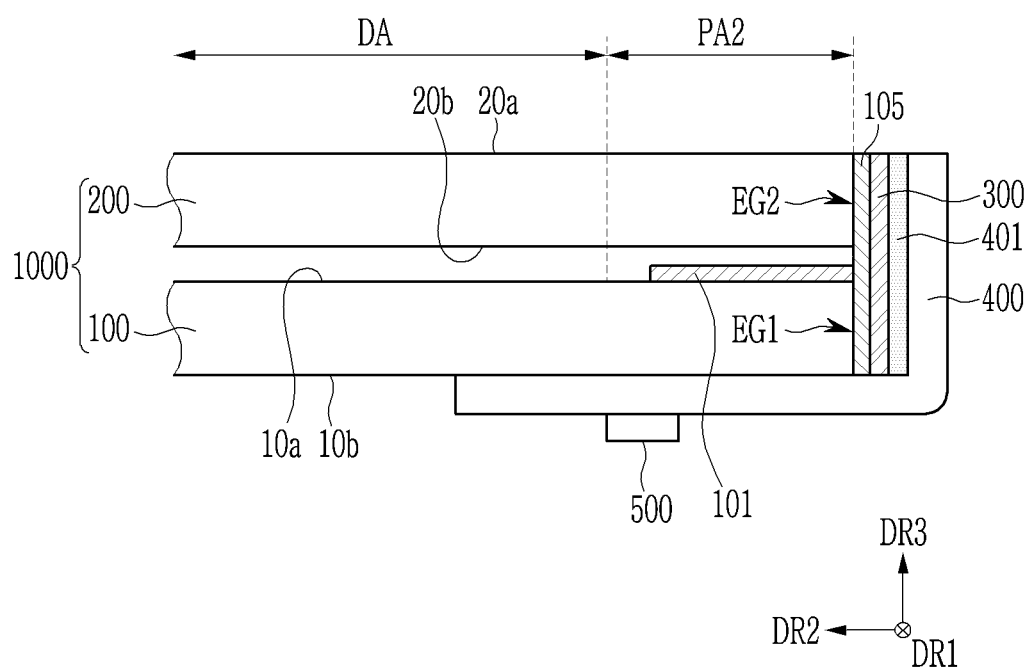

FIG. 4 and FIG. 5 show a cross-sectional view of different portions of the display device shown in FIG. 1, respectively. In more detail, FIG. 4 shows a cross-sectional view of a portion of the display device in which a touch peripheral signal line 201 and a touch lateral wire 205 are positioned, and FIG. 5 shows a cross-sectional view of a portion of the display device in which a peripheral signal line 101 and a lateral wire 105 are positioned.

The embodiments shown in FIG. 4 and FIG. 5 may correspond to (e.g., may be the same or substantially the same as) the embodiments described above with reference to FIG. 2 and FIG. 3, except that the embodiments of FIGS. 4 and 5 show an example in which there is no space between the portion of the flexible printed circuit film 400 that is bent at the lower corner of the first substrate 100 and the lower side 10b of the first substrate 100, and thus, the portion of the flexible printed circuit film 400 may be closely attached to the lower side 10b of the first substrate 100.

Figure 6:
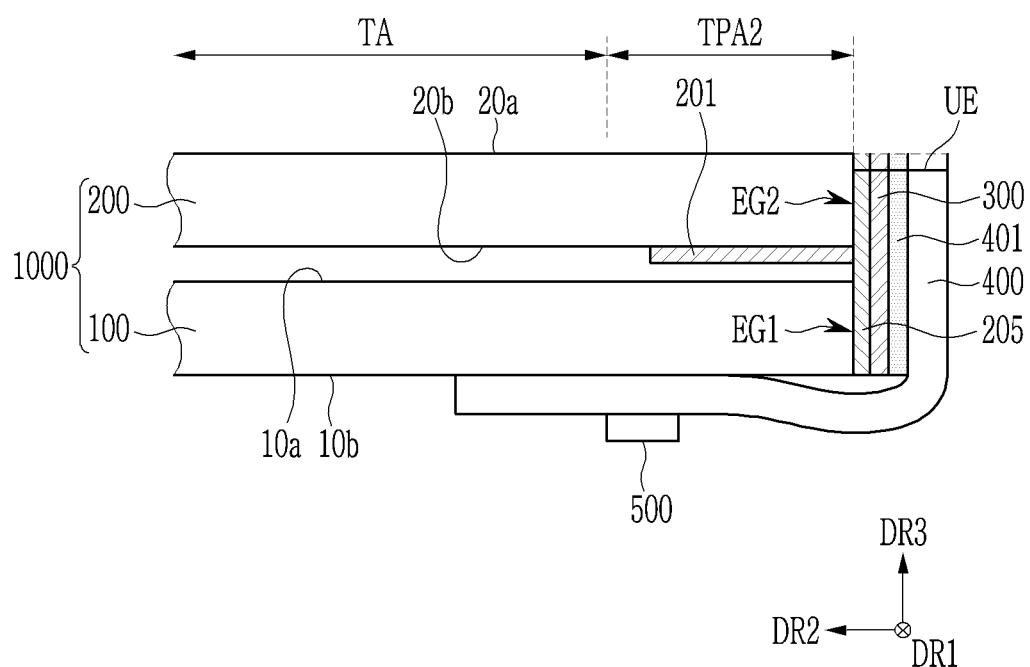
FIG. 6 shows a cross-sectional view of a portion of the display device shown in FIG. 1.

FIG. 6 shows a cross-sectional view of a portion of the display device shown in FIG. 1. The embodiment shown in FIG. 6 may be different from the embodiment described above with reference to FIG. 2, in that FIG. 6 illustrates an example in which the touch peripheral signal line 201 is formed on the lower side 20b of the second substrate 200. Referring to FIG. 6, because the touch peripheral signal line 201 may be formed on the lower side 20b of the second substrate 200, the touch lateral wire 205 may not need to extend up to an upper end of the lateral side of the edge (EG2) of the second substrate 200 to be connected to the touch peripheral signal line 201. Accordingly, a length of the touch lateral wire 205 in the third direction (DR3) may be reduced. In other words, as shown in FIG. 6, an upper end (UE) of the touch lateral wire 205 may not extend up to the upper side 20a of the second substrate 200, and may be positioned at a central portion (e.g., in a middle portion) of the lateral side of the edge (EG2) of the second substrate 200.

A detailed structure of the display device according to one or more embodiments will now be described in more detail with reference to FIG. 7 to FIG. 9, together with reference to the drawings described above.

Figure 7:
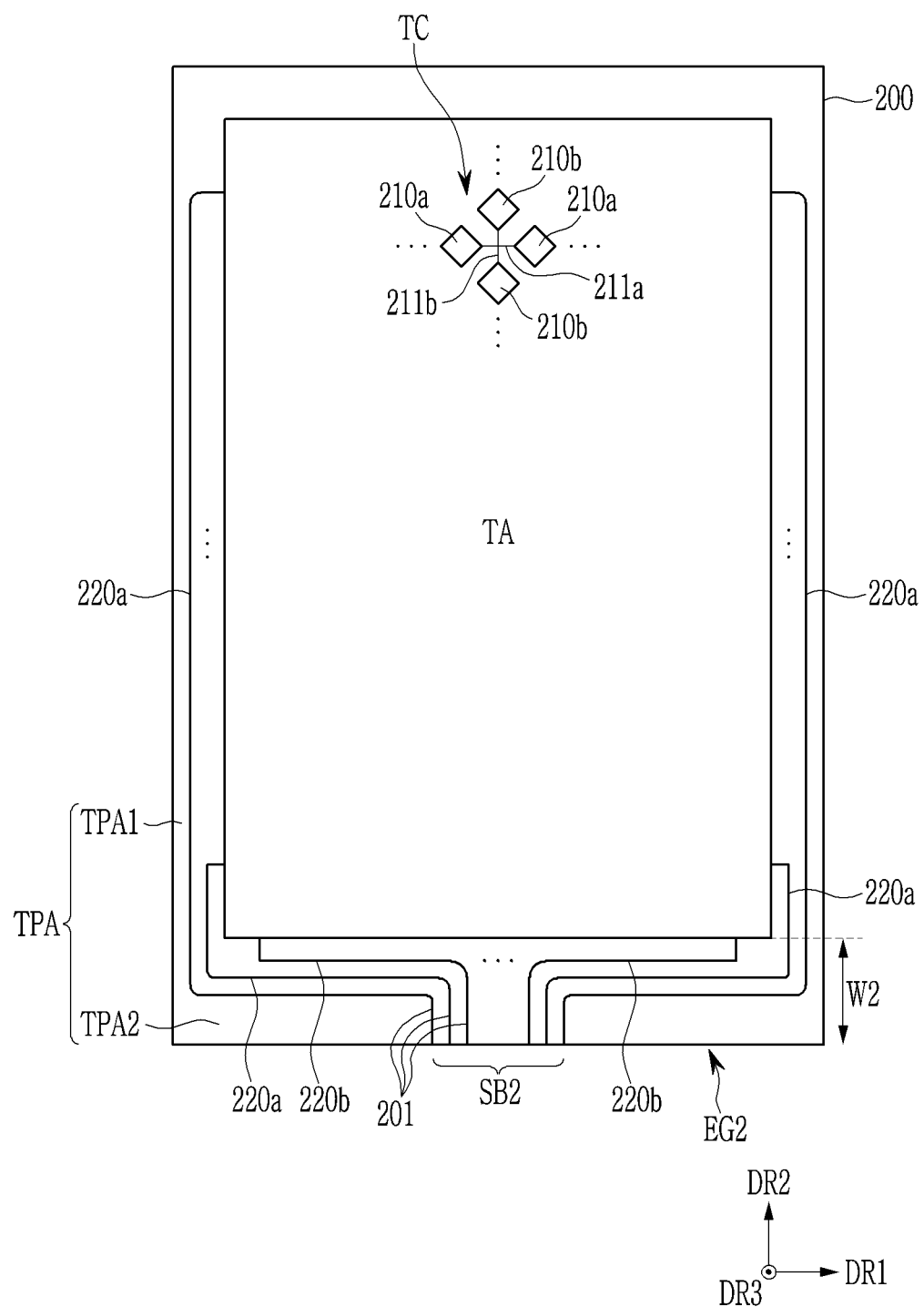
FIG. 7 shows a top plan view of a second substrate of a display device according to an embodiment of the present disclosure.

FIG. 7 shows a top plan view of a second substrate of a display device according to an embodiment of the present disclosure. FIG. 8 and FIG. 9 show a top plan view of a first substrate of a display device according to one or more embodiments of the present disclosure.

Referring to FIG. 7, the touch unit may include the touch region (TA) and the touch bezel area (TPA) as described above.

A plurality of first touch electrodes 210a and second touch electrodes 210b for configuring a mutual capacitive type of touch sensor may be formed at (e.g., in or on) the touch region (TA) as an example of the touch cell TC. Two first touch electrodes 210a neighboring (e.g., that are adjacent to each other) in the first direction (DR1) may be connected to each other with a connection line 211a, and two second touch electrodes 210b neighboring (e.g., that are adjacent to each other) in the second direction (DR2) may be connected to each other with a connection line 211b. The connection line 211a and the connection line 211b may cross each other, and may be insulated from each other.

The first touch electrode 210a and the second touch electrode 210b neighboring (e.g., that are adjacent to) each other may form a mutual sensing capacitor. One from among the first touch electrode 210a and the second touch electrode 210b configuring one mutual sensing capacitor may receive a touch input signal, and a change of charges caused by a touch of an external object may be output through the other one from among the first touch electrode 210a and the second touch electrode 210b as a touch output signal.

A plurality of touch signal lines 220a and 220b may be positioned at (e.g., in or on) the touch bezel area (TPA). The plurality of touch signal lines 220a and 220b may include a first touch signal line 220a connected to the first touch electrode 210a positioned at (e.g., in or on) the border (e.g., the edge) of the touch region (TA), and a second touch signal line 220b connected to a second touch electrode 210b positioned at (e.g., in or on) the border (e.g., the edge) of the touch region (TA).

The first touch signal line 220a may mainly extend in the second direction (DR2) at (e.g., in or on) the first touch bezel area (TPA1), and may configure (e.g., may include) a touch peripheral signal line 201 at (e.g., in or on) the second touch bezel area (TPA2).

The second touch signal line 220b may extend to the second touch bezel area (TPA2) to configure a touch peripheral signal line 201.

The touch peripheral signal lines 201 of the first and second touch signal lines 220a and 220b may gather to one second region (SB2) positioned at the edge (EG2) of the second substrate 200. The touch peripheral signal lines 201 may be formed up to the edge (EG2) of the second substrate 200. The second region (SB2) may be positioned at a center or substantially at the center of the edge (EG2) of the second substrate 200.

Figure 8:
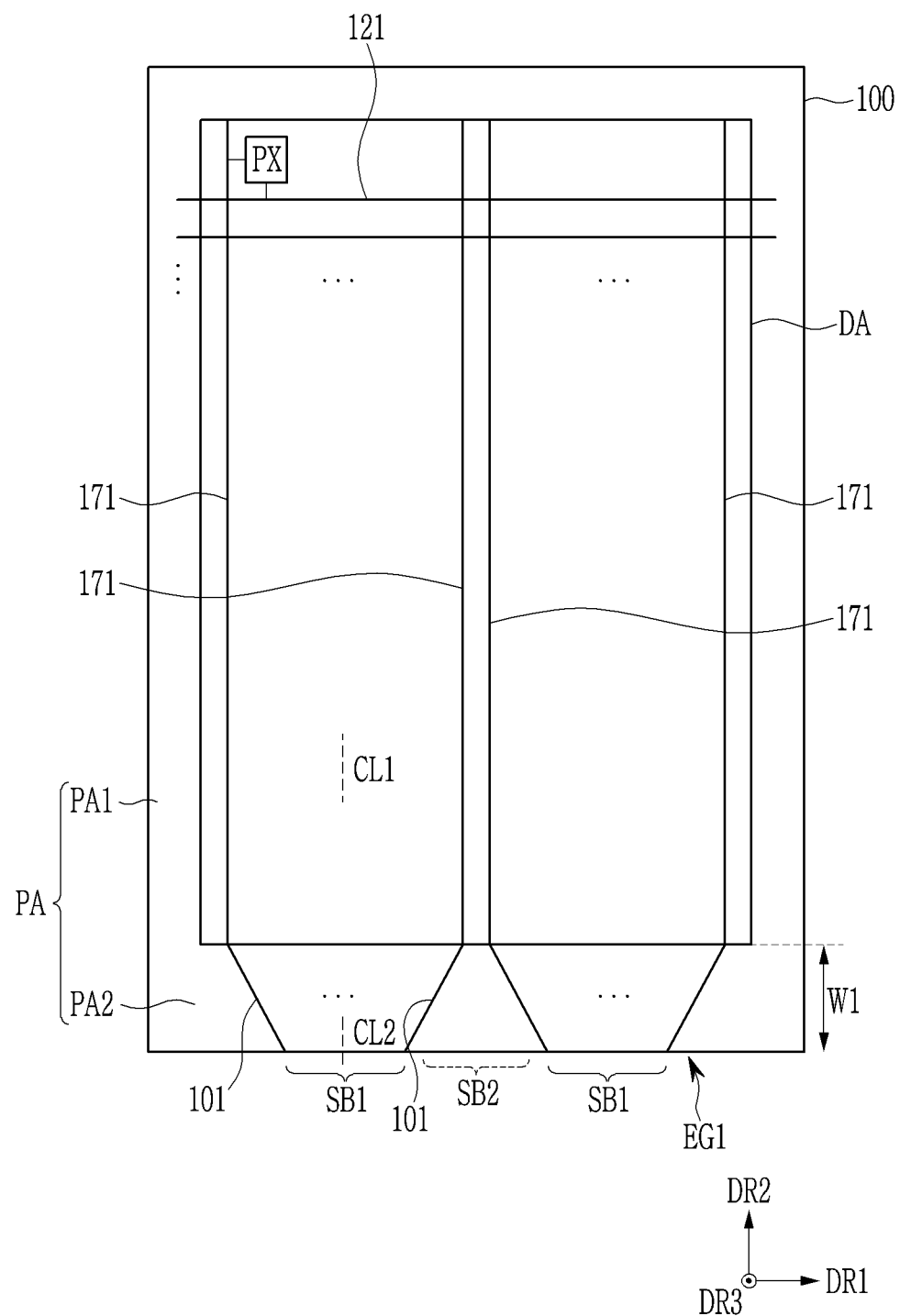
FIGS. 8-9 show a top plan view of a first substrate of a display device according to one or more embodiments of the present disclosure.

Referring to FIG. 8, the display unit may include the display area (DA) and the bezel area (PA) as described above.

The plurality of pixels (PX), and a plurality of signal lines including a plurality of scan lines 121 and a plurality of data lines 171, may be formed at (e.g., in or on) the display area (DA).

The plurality of scan lines 121 may transmit gate signals. The scan lines 121 may extend or substantially extend in the first direction (DR1), and may be arranged (e.g., may be sequentially arranged) along the second direction (DR2). The scan lines 121 may extend to the first bezel area PA1, and may be connected to a gate driving circuit. The gate driving circuit may be formed at (e.g., in or on) the first bezel area PA1.

The plurality of data lines 171 may transmit data signals. The data lines 171 may extend or substantially extend in the second direction (DR2), and may be arranged (e.g., may be sequentially arranged) along the first direction (DR1). The data lines 171 may extend in the second bezel area (PA2), and may each configure (e.g., may each include) a corresponding peripheral signal line 101 at (e.g., in or on) the second bezel area (PA2).

The peripheral signal lines 101 may further include one or more peripheral signal lines of various other signal lines, for example, such as driving voltage lines, in addition to the peripheral signal lines 101 of the data lines 171.

The peripheral signal lines 101 may gather to a plurality of first regions (SB1) positioned at the edge (EG1) of the first substrate 100. The peripheral signal lines 101 may be formed up to the edge (EG1) of the first substrate 100. In a plan view, the plurality of peripheral signal lines 101 connected to a plurality of lateral wires 105 positioned at (e.g., in or on) the first region (SB1) may form a fan-out shape in which the distance between the peripheral signal lines 101 decreases as the peripheral signal lines 101 become closer to the edge (EG1) of the first substrate 100 at (e.g., in or on) the second bezel area (PA2). Thus, a sufficient space may be obtained between the plurality of first regions (e.g., between the two first regions) (SB1) that are spaced apart from each other at the edge (EG1) of the first substrate 100. The second region (SB2) described above with reference to FIG. 7 may be positioned between the two first regions (SB1) that are spaced apart from each other in the plan view. Therefore, in the plan view, the first regions (SB1) and the second region (SB2) may not overlap with each other, and may be separated (e.g., may be spaced apart) from each other.

In the embodiment of FIG. 8, a center line (CL2) defining the center of a corresponding first region (SB1) in the first direction (DR1) may be arranged along the second direction (DR2) with, or be close to, a center line (CL1) defining the center in the first direction (DR1) of a portion of the display area (DA) on which the data lines 171 connected to the peripheral signal lines 101 of the corresponding first region (SB1) are located.

Most of or an entirety of the touch region (TA) of the touch unit may correspond to the display area (DA) of the display unit, and may overlap with the display area (DA) of the display unit.

A width W1 of the second bezel area (PA2) of the display unit in the second direction (DR2) may be equal to or different from a width W2 of the second touch bezel area (TPA2) of the touch unit in the second direction (DR2).

Figure 9:
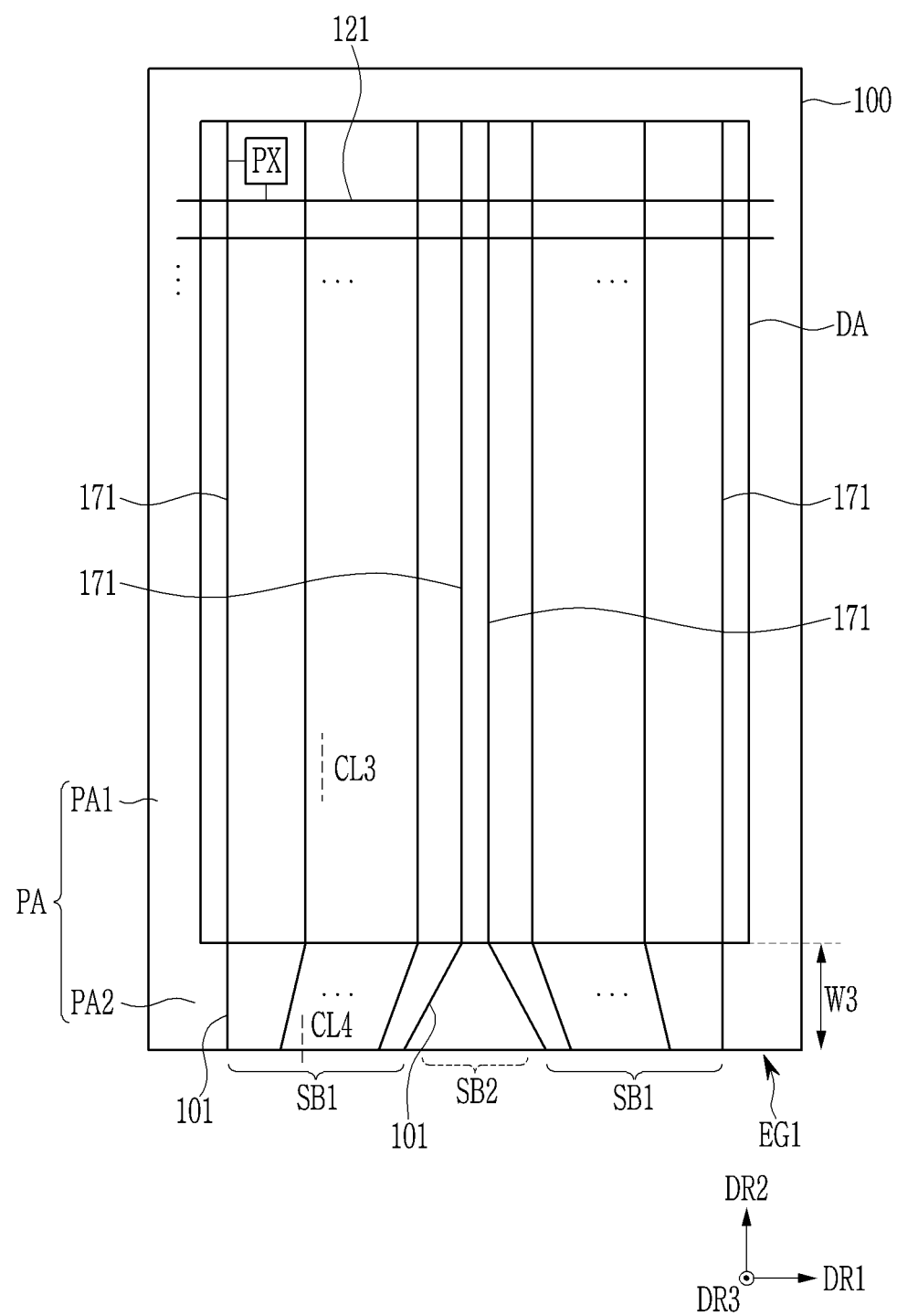

FIG. 9 shows an embodiment of the first substrate 100 that may correspond to (e.g., that may be the same or substantially the same as) the embodiment described above with reference to FIG. 8, except that a structure of the peripheral signal line 101 and a position of the first region (SB1) at (e.g., in or on) the second bezel area (PA2) of FIG. 9 may be different. In more detail, a center line (CL4) defining the center of a corresponding first region (SB1) in the first direction (DR1) of the embodiment of FIG. 9 may be positioned farther from the second region (SB2) in the first direction (DR1) than the center line (CL2) of the corresponding first region (SB1) of the embodiment described above with reference to FIG. 8. Accordingly, a gap between the first region (SB1) and the second region (SB2) neighboring (e.g., that are adjacent to) each other may be further increased. According to the present embodiment, the center line (CL4) of the corresponding first region (SB1) may not correspond to a center line (CL3) defining the center in the first direction (DR1) of a portion of the display area (DA) on which the data lines 171 connected to the peripheral signal lines 101 of the corresponding first region (SB1) are located.

From among the peripheral signal lines 101 connected to the lateral wires 105 included in each first region (SB1), the peripheral signal line 101 that is positioned at (e.g., in or on)

at least one border (e.g., one side end) from among the borders (e.g., from among the opposite side ends) of the corresponding first region (SB1) may extend to be parallel with or substantially parallel with the second direction (DR2) in a plan view. In other words, from among the peripheral signal lines 101 connected to the lateral wires 105 included in each first region (SB1), the peripheral signal line 101 that is positioned at (e.g., in or on) at least one border from among the borders of the corresponding first region (SB1) may extend in a direction that is perpendicular to or substantially perpendicular to a lower border (e.g., a lower edge) of the display area (DA) or the edge (EG1).

In more detail, from among the peripheral signal lines 101 connected to the lateral wires 105 included by each first region (SB1), the peripheral signal line 101 positioned farthest from the second region (SB2) may extend in parallel with or substantially in parallel with the second direction (DR2), and the peripheral signal line 101 positioned the nearest (e.g., closest to) the second region (SB2) may be inclined away (e.g., to be distant) from the second region (SB2) as it becomes closer to the edge (EG1). Accordingly, the width of each first region (SB1) in the first direction (DR1) of the embodiment shown in FIG. 9 may be greater than the width of each first region (SB1) in the first direction (DR1) in the embodiment described above with reference to FIG. 8. Further, according to the present embodiment, the width (W3) of the second bezel area (PA2) of the display unit in the second direction (DR2) may be less than the width (W1) of the second bezel area (PA2) in the second direction (DR2) according to the embodiment described above with reference to FIG. 8.

A display device according to various embodiments including a first region (SB1) and a second region (SB2) with various suitable positions and structures will now be described in more detail with reference to FIG. 10 to FIG. 16, together with reference to the drawings described above.

Figure 10:
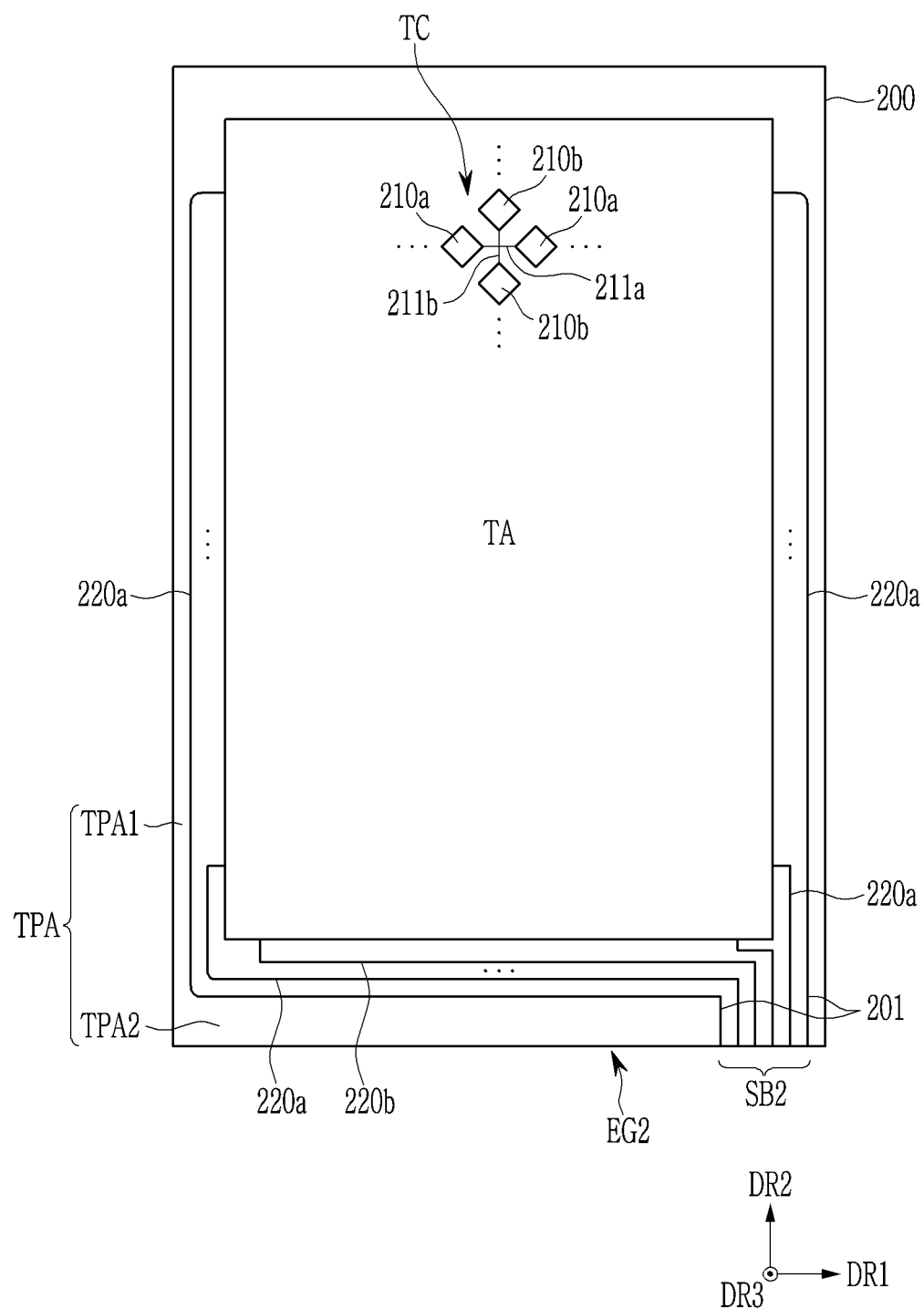
FIG. 10 shows a top plan view of a second substrate of a display device according to an embodiment of the present disclosure.
Figure 11:
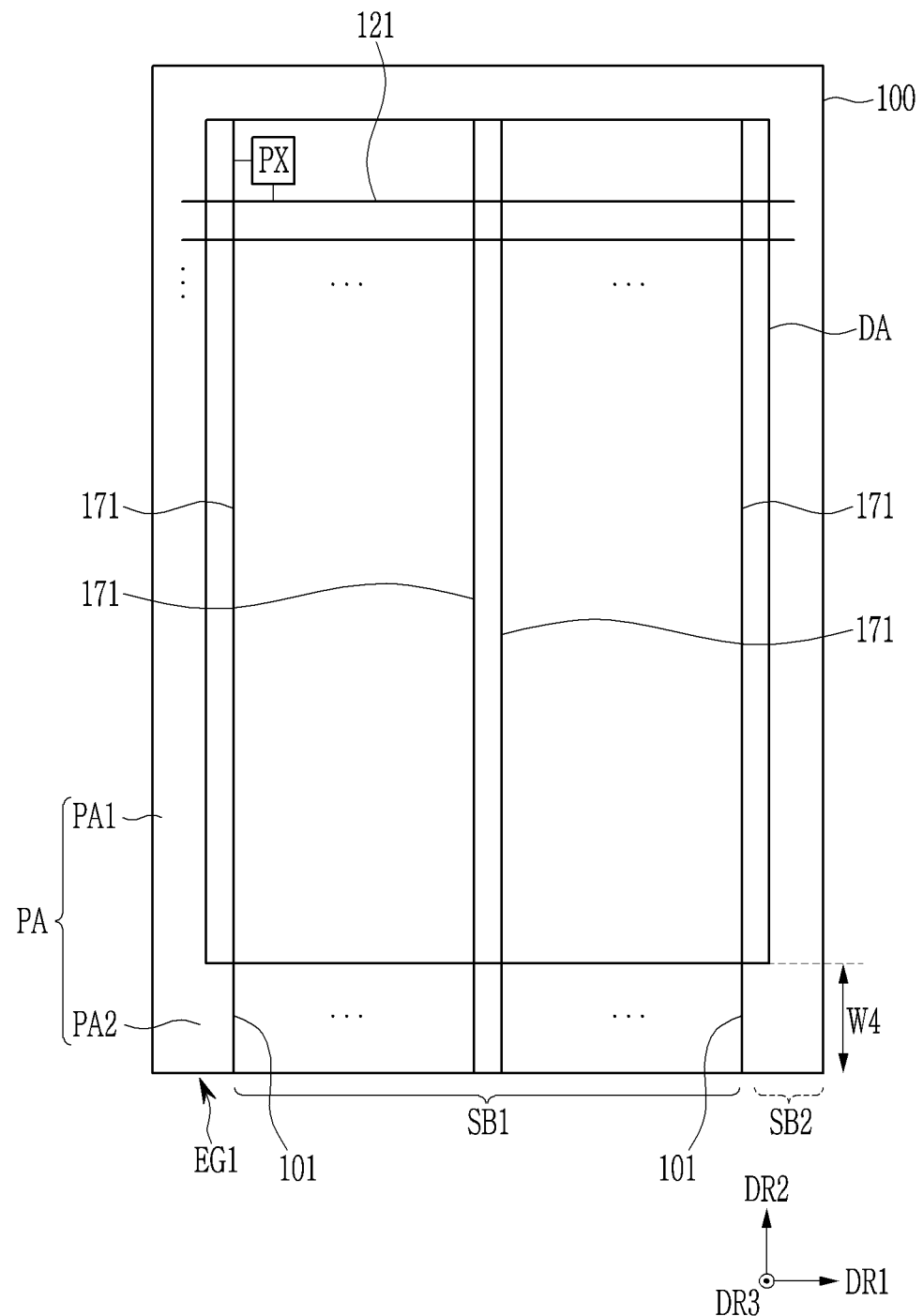
FIG. 11 shows a top plan view of a first substrate of a display device according to an embodiment of the present disclosure.

FIG. 10 shows a top plan view of a second substrate of a display device according to an embodiment of the present disclosure, and FIG. 11 shows a top plan view of a first substrate of a display device according to an embodiment of the present disclosure.

Referring to FIG. 10, the touch unit according to an embodiment, or in other words, the second substrate 200, may correspond to (e.g., may be the same or substantially the same as) the embodiment described above with reference to FIG. 7, except that the second region (SB2) may be positioned near (e.g., adjacent to) a border (e.g., an edge) of a left side (e.g., a left end) or a right side (e.g., a right end) of the edge (EG2).

Referring to FIG. 11, the display unit according to an embodiment, or in other words, the first substrate 100, may correspond to (e.g., may be the same or substantially the same as) the embodiment described above with reference to FIG. 8, except that one continuous first region (SB1) may occupy a majority of the edge (EG1). A width of the first region (SB1) in the first direction (DR1) may be greater than a width of the second region (SB2) in the first direction (DR1).

A plurality of peripheral signal lines 101 connected to the lateral wires 105 included by the first region (SB1) may extend in parallel with or substantially in parallel with the second direction (DR2) at (e.g., in or on) the second bezel area (PA2). Accordingly, the width of the first region (SB1) in the first direction (DR1) may be greater than a width of each first region (SB1) in the first direction (DR1) in the embodiment described above with reference to FIG. 9. Further, according to the present embodiment, the width (W4) of the second bezel area (PA2) of the display unit in the second direction (DR2) may be less than the width (W3) of the second bezel area (PA2) in the second direction (DR2) of the embodiment described above with reference to FIG. 9.

Referring to FIG. 10 and FIG. 11, the second region (SB2) is positioned at (e.g., in or on) a right or left border in a plan view, so the first region (SB1) and the second region (SB2) may not overlap with each other, and may be separated (e.g., spaced apart) from each other. The peripheral signal lines 101 do not configure the above-described fan-out shape at (e.g., in or on) the second bezel area (PA2), so the width of the second bezel area (PA2) in the second direction (DR2) may be further reduced.

Figure 12:
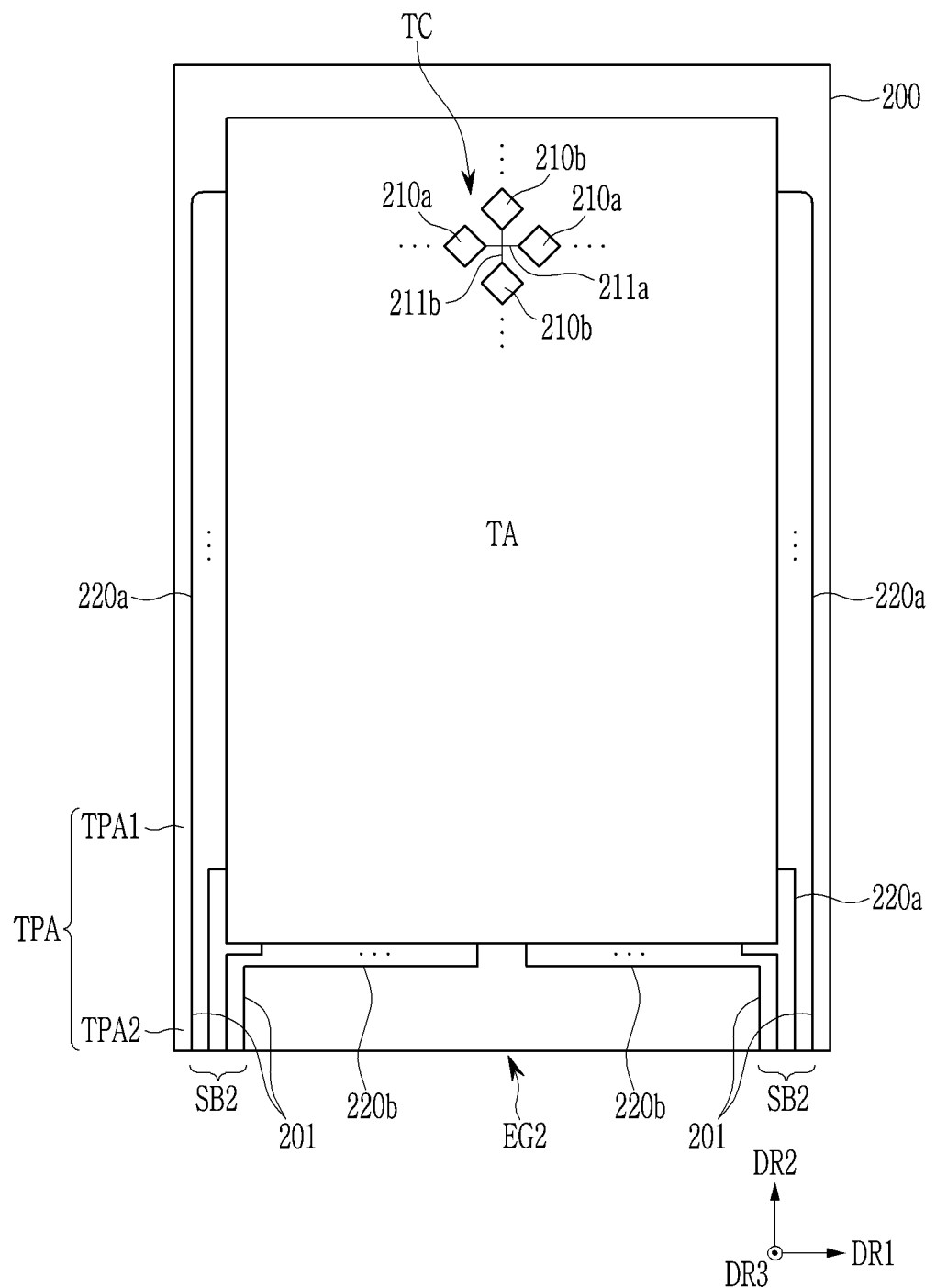
FIG. 12 shows a top plan view of a second substrate of a display device according to an embodiment of the present disclosure.
Figure 13:
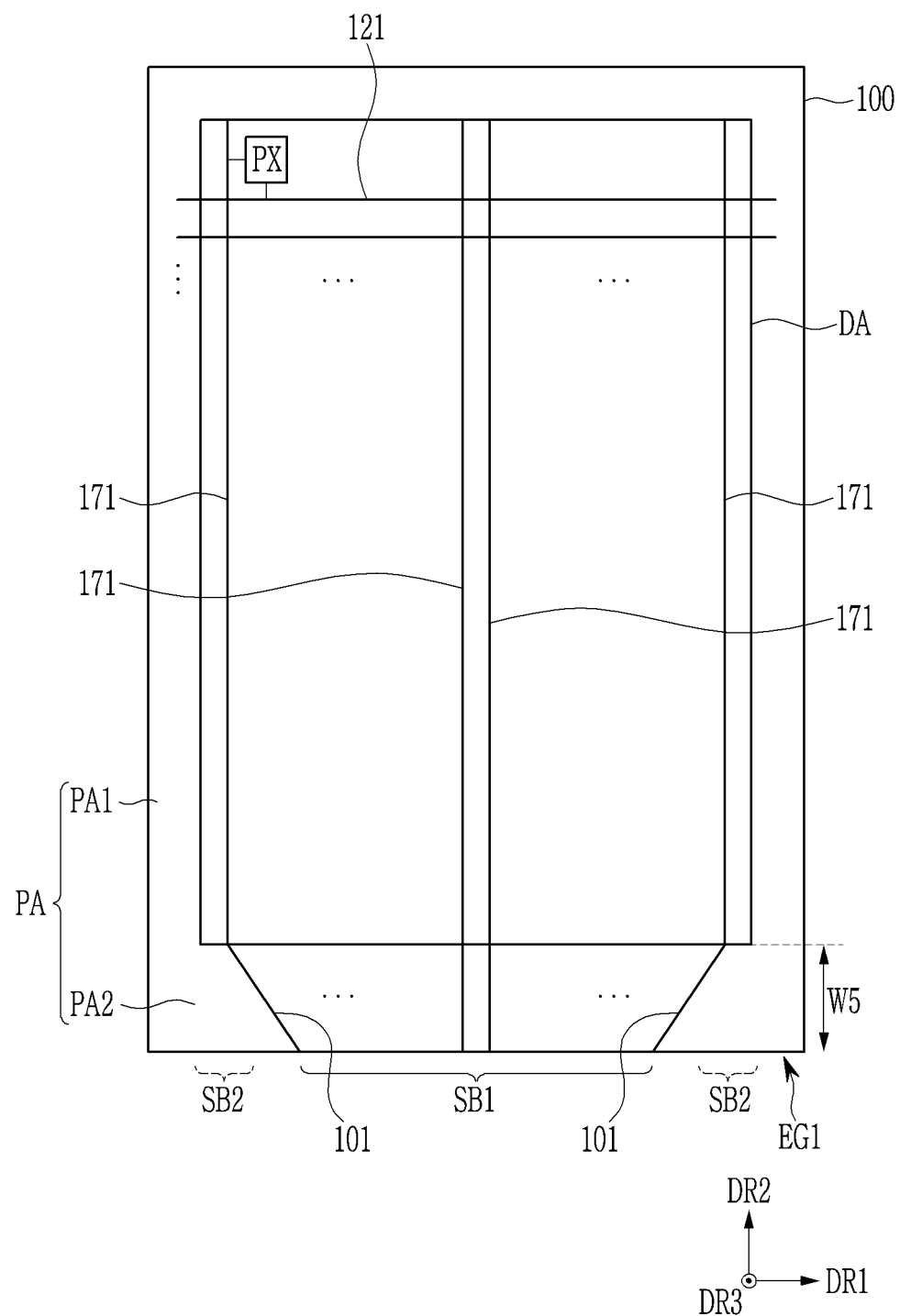
FIGS. 13-14 show a top plan view of a first substrate of a display device according to one or more embodiments of the present disclosure.

FIG. 12 shows a top plan view of a second substrate of a display device according to an embodiment of the present disclosure, and FIG. 13 shows a top plan view of a first substrate of a display device according to an embodiment of the present disclosure.

Referring to FIG. 12 and FIG. 13, in a display device according to an embodiment, a first region (SB1) may be positioned between two second regions (SB2) positioned on respective borders of the lateral side of the display panel of the edges (EG1 and EG2).

Referring to FIG. 12, the touch unit according to an embodiment, or in other words, the second substrate 200, may correspond to (e.g., may be the same or substantially the same as) the embodiment described above with reference to FIG. 7, except two second regions (SB2) may be positioned at (e.g., in or on) the right and left borders of the edge (EG2). The left second region (SB2) may include touch peripheral signal lines 201 of first touch signal lines 220a connected to the left of the touch region (TA), and touch peripheral signal lines 201 of second touch signal lines 220b connected to a left half portion of the touch region (TA). The right second region (SB2) may include touch peripheral signal lines 201 of first touch signal lines 220a connected to the right of the touch region (TA), and touch peripheral signal lines 201 of second touch signal lines 220b connected to a right half portion at a lower end of the touch region (TA). The width of each second region (SB2) in the first direction (DR1) according to the present embodiment may be less than the width of each second region (SB2) in the first direction (DR1) according to the embodiment described above with reference to FIG. 7 or FIG. 10.

Referring to FIG. 13, the display unit according to an embodiment, or in other words, the first substrate 100, may correspond to (e.g., may be the same or substantially the same as) the embodiment described above with reference to FIG. 8, except the peripheral signal lines 101 of all the data lines 171 may gather toward one continuous first region (SB1). In other words, the peripheral signal lines 101 may gather to the first region (SB1) positioned near the edge (EG1) of the first substrate 100. The plurality of peripheral signal lines 101 may have a fan-out shape in which a distance therebetween decreases as the peripheral signal lines 101 become closer to the edge (EG1) of the first substrate 100 at (e.g., in or on) the second bezel area (PA2). The peripheral signal line 101 of a data line 171 that is positioned or substantially positioned at (e.g., in or on) the center of the display area (DA) may extend to be in parallel with or substantially in parallel with the second direction (DR2) at (e.g., in or on) the second bezel area (PA2).

The first region (SB1) is positioned between the two second regions (SB2) that are spaced from each other in a plan view, so the first region (SB1) and the second region (SB2) may not overlap with each other and may be separated (e.g., spaced apart) from each other.

Figure 14:
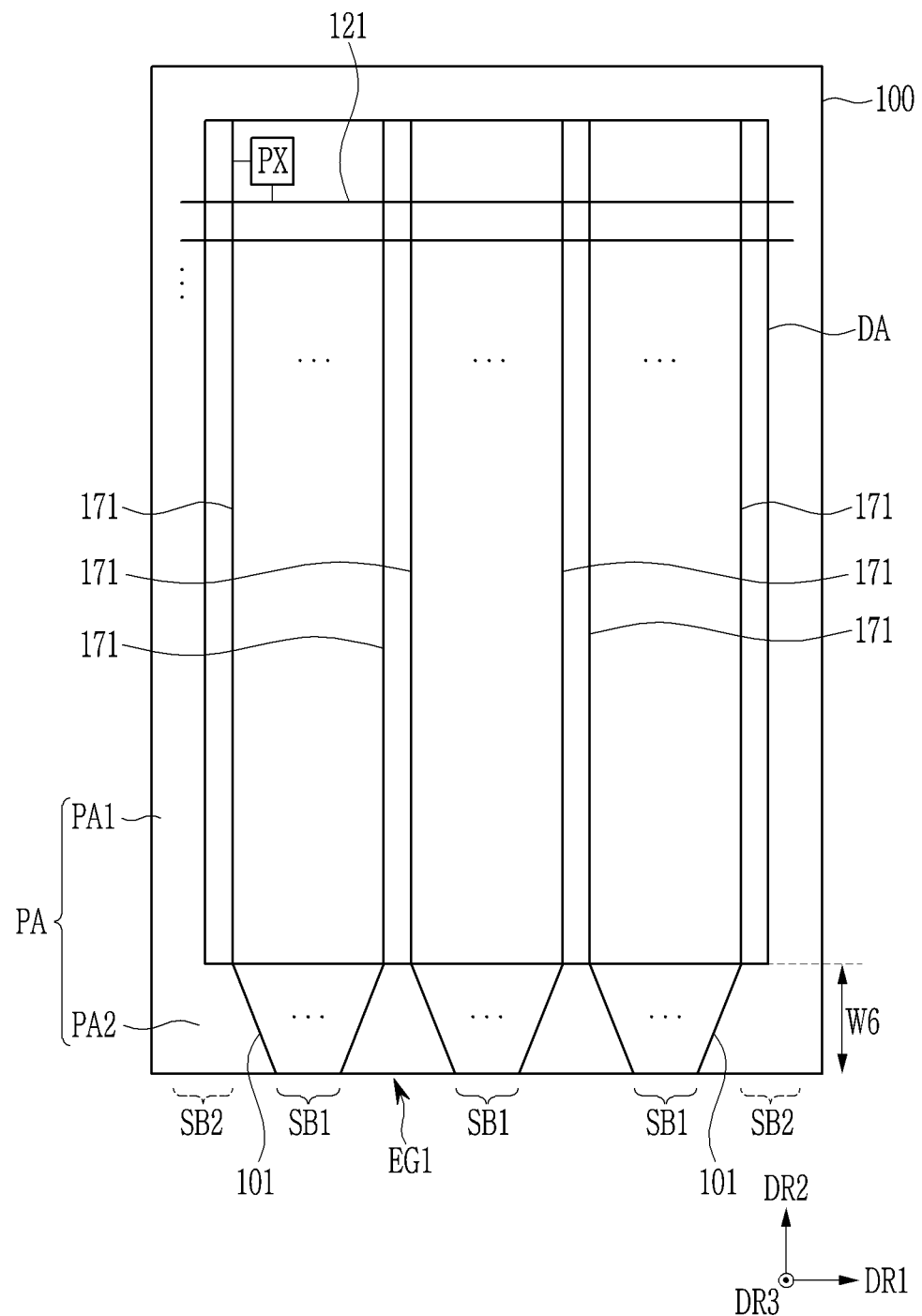

FIG. 14 shows a top plan view of a first substrate of a display device according to an embodiment of the present disclosure.

Referring to FIG. 14, the display device according to an embodiment may correspond to (e.g., may be the same or substantially the same as) the embodiments described above with reference to FIG. 12 and FIG. 13, except that the shape and the position of the display unit, or in other words, the first region (SB1) of the first substrate 100, may be different.

Differing from the embodiment described above with reference to FIG. 13, a plurality of peripheral signal lines 101 may be disposed as groups corresponding to a plurality of first regions (SB1) at (e.g., in or on) the second bezel area (PA2). As shown in FIG. 1, in a plan view, the plurality of first regions (SB1) may be positioned between the two second regions (SB2) that are positioned at (e.g., in or on) respective borders of the lateral side of the display panel of the edges (EG1 and EG2). The plurality of peripheral signal lines 101 connected to the lateral wires 105 included by each first region (SB1) may form a fan-out shape in which the distance therebetween decreases as they become closer to (e.g., nearer) the edge (EG1) of the first substrate 100 in a plan view.

According to the embodiment shown in FIG. 14, the plurality of peripheral signal lines 101 are disposed to have a fan-out shape at points where they correspond to the plurality of first regions (SB1) at (e.g., in or on) the second bezel area (PA2), so the width of the second bezel area (PA2) in the second direction (DR2) may be further reduced when compared to the embodiment described above with reference to FIG. 13. In other words, in the embodiment shown in FIG. 14, a width (W6) of the second bezel area (PA2) in the second direction (DR2) may be less than a width (W5) of the second bezel area (PA2) in the second direction (DR2) in the embodiment described above with reference to FIG. 13.

In a plan view, the plurality of first regions (SB1) are positioned between the two second regions (SB2) that are spaced from each other, so the first regions (SB1) and the second regions (SB2) may not overlap with each other and may be separated (e.g., spaced apart) from each other.

Figure 15:
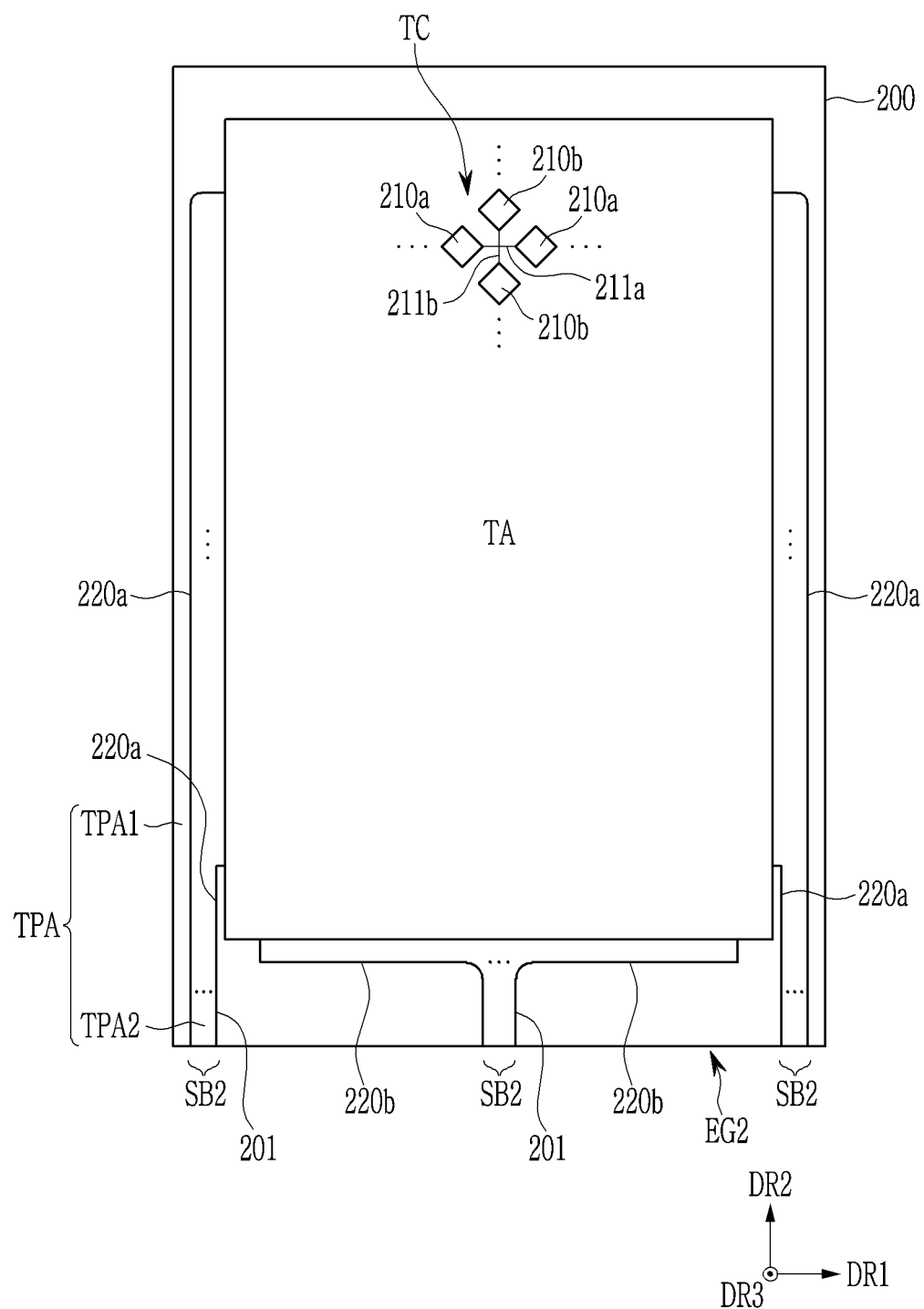
FIG. 15 shows a top plan view of a second substrate of a display device according to an embodiment of the present disclosure.
Figure 16:
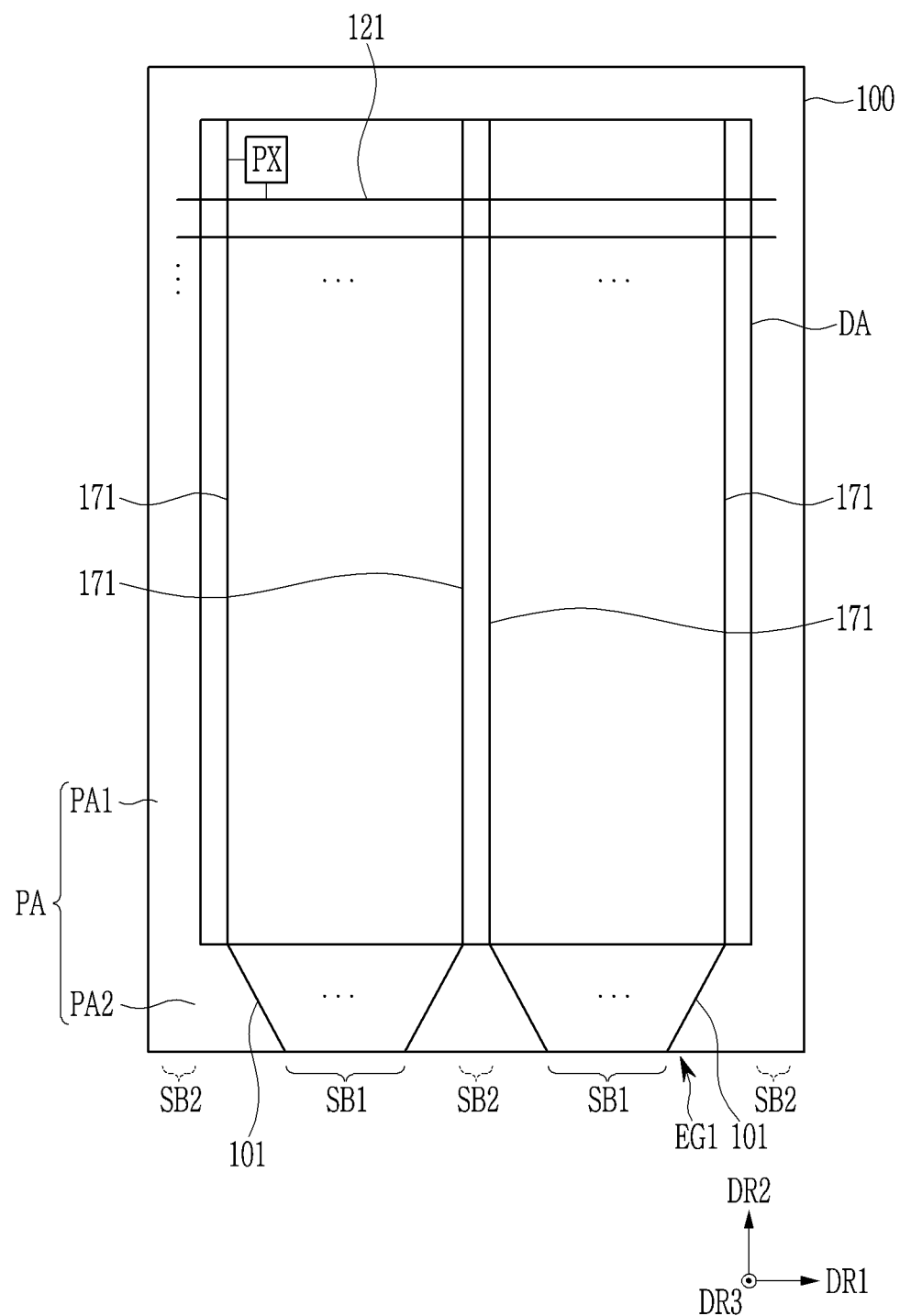
FIG. 16 shows a top plan view of a first substrate of a display device according to an embodiment of the present disclosure.

FIG. 15 shows a top plan view of a second substrate of a display device according to an embodiment of the present disclosure, and FIG. 16 shows a top plan view of a first substrate of a display device according to an embodiment of the present disclosure.

Referring to FIG. 15 and FIG. 16, a plurality of first regions (SB1) and a plurality of second regions (SB2) may be positioned on the lateral side of the display panel of the edges (EG1 and EG2) in the display device according to an embodiment. In a plan view, the first region (SB1) and the second region (SB2) may be alternately arranged along the first direction (DR1).

Referring to FIG. 15, three second regions (SB2) that are spaced from each other may be arranged along the edge (EG2) of the touch unit according to an embodiment, or in other words, the second substrate 200. The touch lateral wire 205 included by the second region (SB2) on the left side may be connected to the touch peripheral signal line 201 of the first touch signal lines 220a connected to the left side of the touch region (TA). The touch lateral wire 205 included by the second region (SB2) positioned at (e.g., in or on) the center may be connected to the touch peripheral signal line 201 of the second touch signal lines 220b connected to the lower end of the touch region (TA). The touch lateral wire 205 included by the second region (SB2) on the right side may be connected to the touch peripheral signal line 201 of the first touch signal lines 220a connected to the right side of the touch region (TA). The width of each second region (SB2) in the first direction (DR1) according to the present embodiment may be less than the width of each second region (SB2) in the first direction (DR1) according to the embodiment described above with reference to FIG. 12.

Referring to FIG. 16, the display unit according to an embodiment, or in other words, the first substrate 100, may correspond to (e.g., may be the same or substantially the same as) the embodiment described above with reference to FIG. 8. In other words, the peripheral signal lines 101 may be disposed corresponding to the plurality of first regions (SB1) positioned at the edge (EG1) of the first substrate 100. In a plan view, the plurality of peripheral signal lines 101 connected to the plurality of lateral wires 105 included by each first region (SB1) may have a fan-out shape in which the distance therebetween decreases as they become closer to (e.g., nearer) the edge (EG1) of the first substrate 100 at (e.g., in or on) the second bezel area (PA2).

A first region (SB1) may be positioned between two second regions (SB2) that are spaced from each other in a plan view. Therefore, the first region (SB1) and the second region (SB2) may not overlap with each other, and may be separated (e.g., spaced apart) from each other in the plan view.

A cross-sectional structure of a display device according to one or more embodiments will now be described with reference to FIG. 17 and FIG. 18, together with the drawings described above.

Figure 17:
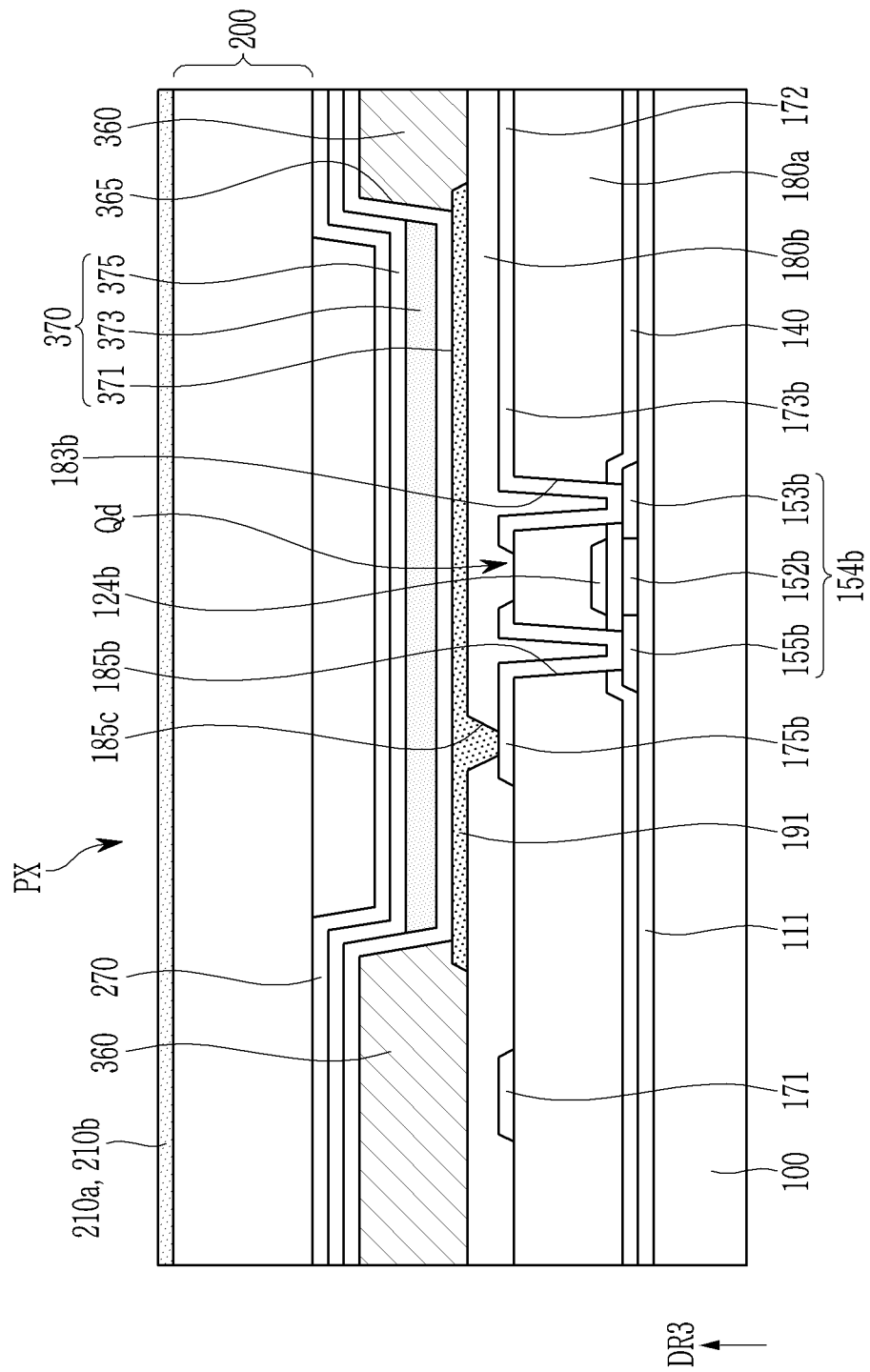
FIGS. 17-18 show a cross-sectional view of a display device according to one or more embodiments of the present disclosure.
Figure 18:
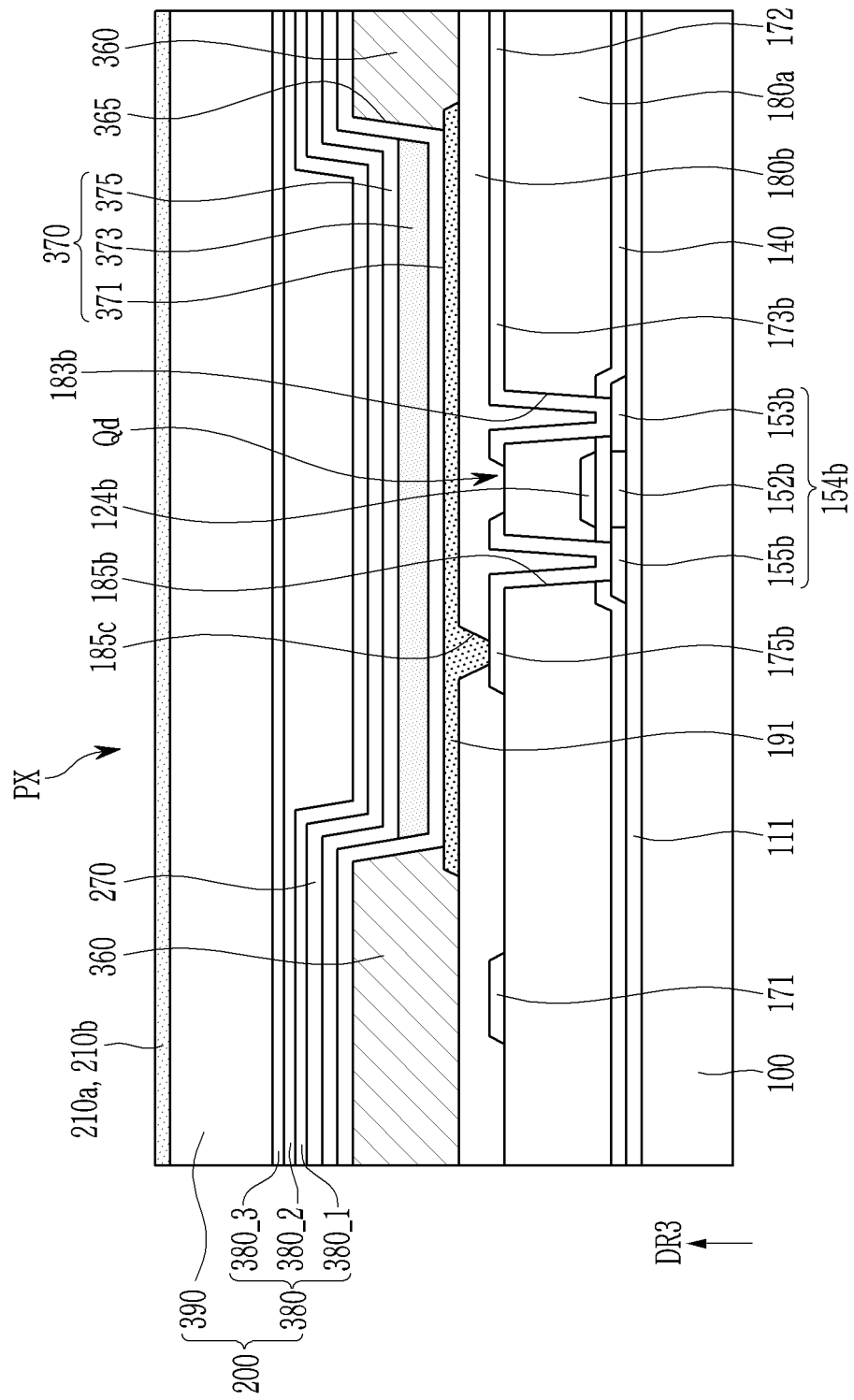

FIG. 17 and FIG. 18 show a cross-sectional view of a pixel of a display device according to one or more embodiments of the present disclosure.

Referring to FIG. 17, the display device according to an embodiment may be an emissive display device.

A barrier layer 111 including an insulating material may be positioned on the first substrate 100. The barrier layer 111 may prevent or substantially prevent external impurities from passing through the first substrate 100, and penetrating to an upper side. However, the present disclosure is not limited thereto, and the barrier layer 111 may be omitted.

A semiconductor layer 154b including a channel region 152b, and a source region 153b and a drain region 155b positioned at (e.g., in or on) respective sides of the channel region 152b and formed to be doped, may be positioned on the barrier layer 111. The semiconductor layer 154b may include amorphous silicon, polysilicon, or a metal oxide.

A gate insulating layer 140 including an inorganic insulating material may be positioned on the semiconductor layer 154b.

A gate conductive layer including a gate electrode 124b may be positioned on the gate insulating layer 140. The gate conductive layer may further include the plurality of scan lines 121 described above. The gate electrode 124b may overlap with the channel region 152b.

An inter-layer insulating layer 180a may be positioned on the gate conductive layer. The inter-layer insulating layer 180a and the gate insulating layer 140 may include contact holes 183b and 185b positioned at (e.g., in or on) the source region 153b and the drain region 155b of the semiconductor layer 154b.

A plurality of data conductive layers including a plurality of data lines 171, a plurality of input electrodes 173b, and a plurality of output electrodes 175b may be positioned on the inter-layer insulating layer 180a. The input electrode 173b may be connected to the data line 171, and the output electrode 175b may be separated (e.g., spaced apart) from the data line 171. The input electrode 173b and the output electrode 175b may be electrically connected to the source region 153b and the drain region 155b of the semiconductor layer 154b through the contact holes 183b and 185b.

The gate electrode 124b, the channel region 152b, the source region 153b, and the drain region 155b may configure a driving thin film transistor (Qd).

A passivation layer 180b including an insulating material may be positioned on the data conductive layers. The passivation layer 180b may have a contact hole 185c positioned at (e.g., on) the output electrode 175b.

A plurality of pixel electrodes 191 may be positioned on the passivation layer 180b. The pixel electrode 191 of each pixel (PX) is electrically connected to a corresponding output electrode 175b through a corresponding contact hole 185c of the passivation layer 180b. The pixel electrode 191 may include a semi-transmitting conductive material or a reflective conductive material.

An insulating layer 360 including an opening 365 positioned at (e.g., on) the pixel electrode 191 may be positioned on the passivation layer 180b.

A light-emitting member 370 may be positioned on the insulating layer 360 and the pixel electrode 191. The light-emitting member 370 may include a first common layer 371, an emission layer 373, and a second common layer 375 that are sequentially stacked from the bottom. The first common layer 371 may, for example, include a hole injecting layer and a hole transport layer. The emission layer 373 may be positioned on the pixel electrode 191 of the corresponding pixel (PX). The emission layer 373 may include an organic or inorganic material for uniquely emitting light of at least one of primary colors, for example, such as red, green, and/or blue, and may have a structure including a plurality of light emitting material layers for outputting light of different colors. The second common layer 375 may, for example, include an electron transport layer and an electron injecting layer. However, the present disclosure is not limited thereto, and at least one of the first and second common layers 371 and 375 may be omitted.

A common electrode 270 for transmitting a common voltage may be positioned on the light-emitting member 370.

The pixel electrode 191, the light-emitting member 370, and the common electrode 270 of each pixel (PX) configure a light-emitting device. One from among the pixel electrode 191 and the common electrode 270 may be a cathode, and the other from among the pixel electrode 191 and the common electrode 270 may be an anode.

The second substrate 200 may be positioned on the common electrode 270. The second substrate 200 may prevent or substantially prevent moisture and/or oxygen from permeating from the outside by encapsulating the light-emitting member 370 and the common electrode 270.

The constituent elements positioned between the first substrate 100 and the second substrate 200 may configure the above-described pixel (PX).

A touch conductive layer including a plurality of touch electrodes 210a and 210b and a plurality of touch signal lines may be positioned on the second substrate 200.

Referring to FIG. 18, the display device according to the present embodiment may correspond to (e.g., may be the same or substantially the same as) the embodiment described above with reference to FIG. 17, but the second substrate 200 may be different.

The second substrate 200 according to the present embodiment may include a plurality of insulating layers 380_1, 380_2, 380_3, and 390. The plurality of insulating layers 380_1, 380_2, 380_3, and 390 may include at least two inorganic layers 380_1 and 380_3, and at least one organic layer 380_2 positioned between the two neighboring (e.g., adjacent) inorganic layers 380_1 and 380_3. The inorganic layers 380_1 and 380_3 may include an inorganic material, for example, such as an aluminum oxide (AlOx), a silicon oxide (SiOx), and/or a silicon nitride (SiNx). The organic layer 380_2 may include an organic material, and may have a planar or substantially planar upper side.

The insulating layer 390 may include an organic material, and may have a planar or substantially planar upper side. However, the present disclosure is not limited thereto, and the insulating layer 390 may be omitted.

According to various embodiments of the present disclosure, the flexible printed circuit film may not need to access the peripheral signal line 101 and the touch peripheral signal line 201 on the respective upper sides 10a and 20a of the first substrate 100 and the second substrate 200 of the display device, and thus, areas of the second bezel area (PA2) and the second touch bezel area (TPA2) may be further reduced. Further, the touch unit and the display unit may be driven by using the driving circuit unit 500 that is configurable with one flexible printed circuit film 400 and one IC chip, thereby further reducing manufacturing costs.

Although some example embodiments have been described, those skilled in the art will readily appreciate that various modifications are possible in the example embodiments without departing from the spirit and scope of the present disclosure. Therefore, it is to be understood that the foregoing is illustrative of various example embodiments and is not to be construed as limited to the specific example embodiments disclosed herein, and that various modifications to the disclosed example embodiments, as well as other example embodiments, are intended to be included within the spirit and scope of the present disclosure as defined in the appended claims, and their equivalents.

DESCRIPTION OF SYMBOLS 100, 200: substrate
101: peripheral signal line
105: lateral wire
201: touch peripheral signal line
205: touch lateral wire
300: connector
400: flexible printed circuit film
500: driving circuit unit

What is claimed is:
1. A display device comprising:
a first substrate;
a second substrate opposing the first substrate;
a first signal line on the first substrate;
a first lateral wire connected to end portions of the first signal line; and
a flexible printed circuit film comprising an access wire electrically connected to the first lateral wire,
wherein the first lateral wire is on a first lateral surface at a first edge of the first substrate and on a second lateral surface at a second edge of the second substrate, and
wherein the first edge and the second edge are aligned with each other.
2. The display device of claim 1, wherein the first lateral wire overlaps the first lateral surface and the second lateral surface.

3. The display device of claim 1, wherein the first signal line extends in a first direction, and the first lateral wire extends in a second direction different from the first direction.

4. The display device of claim 3, wherein the first lateral wire has a first end and a second end at opposite sides, and
wherein the first end is on and overlaps the first lateral surface, and the second end is on and overlaps the second lateral surface.

5. The display device of claim 1, wherein the flexible printed circuit film is attached to the first lateral surface and the second lateral surface.

6. The display device of claim 5, further comprising a driving circuit on the flexible printed circuit film,
wherein the access wire is connected to the driving circuit.

7. The display device of claim 5, wherein the first signal line comprises a data line configured to transmit a data signal.

8. The display device of claim 5, wherein the first signal line comprises a touch signal line configured to transmit a touch signal.

9. The display device of claim 1, wherein the first substrate comprises a display area for displaying an image, and a bezel area around the display area, and
wherein the first signal line comprises a peripheral signal line at the bezel area, the bezel area being between the display area and the first edge.

10. The display device of claim 1, wherein the first substrate comprises a touch region for sensing a touch, and a touch bezel area around a periphery of the touch region, and
wherein the first signal line comprises a peripheral signal line at the touch bezel area, the touch bezel area being between the touch region and the first edge.

11. The display device of claim 1, further comprising:
a second signal line on the second substrate.

12. A display device comprising:
a first substrate;
a second substrate opposing the first substrate;
a first signal line on the first substrate; and
a first lateral wire connected to end portions of the first signal line,
wherein the first lateral wire is on a first lateral surface at a first edge of the first substrate and on a second lateral surface at a second edge of the second substrate,
wherein the first edge and the second edge are aligned with each other,
wherein the first substrate comprises a touch region for sensing a touch and a touch bezel area around a periphery of the touch region, and
wherein the first signal line comprises a peripheral signal line at the touch bezel area, the touch bezel area being between the touch region and the first edge.

13. A display device comprising:
a first substrate;
a second substrate opposing the first substrate;
a first signal line on the first substrate;
a second signal line on the second substrate; and
a first lateral wire connected to end portions of the first signal line,
wherein the first lateral wire is on a first lateral surface at a first edge of the first substrate and on a second lateral surface at a second edge of the second substrate, and
wherein the first edge and the second edge are aligned with each other.

* * * * *